United States Patent
Kurata et al.

(10) Patent No.: US 9,171,959 B2
(45) Date of Patent: Oct. 27, 2015

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Motomu Kurata, Isehara (JP); Shinya Sasagawa, Chigasaki (JP); Taiga Muraoka, Atsugi (JP); Tetsuhiro Tanaka, Isehara (JP); Junichi Koezuka, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/700,528

(22) Filed: Apr. 30, 2015

(65) Prior Publication Data
US 2015/0236166 A1    Aug. 20, 2015

Related U.S. Application Data

(62) Division of application No. 13/686,332, filed on Nov. 27, 2012, now Pat. No. 9,048,321.

(30) Foreign Application Priority Data

Dec. 2, 2011   (JP) ................................ 2011-264383

(51) Int. Cl.
*H01L 21/00*   (2006.01)
*H01L 29/786*  (2006.01)

(52) U.S. Cl.
CPC .................. *H01L 29/7869* (2013.01)

(58) Field of Classification Search
USPC ........................................................ 438/104
See application file for complete search history.

(56) References Cited

U.S. PATENT DOCUMENTS

| | | |
|---|---|---|
| 5,289,030 A | 2/1994 | Yamazaki et al. |
| 5,731,856 A | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, 13, pp. 2541-2543.

(Continued)

*Primary Examiner* — Marvin Payen
(74) *Attorney, Agent, or Firm* — Eric J. Robinson; Robinson Intellectual Property Law Office, P.C.

(57) ABSTRACT

Provided is a miniaturized transistor with stable and high electrical characteristics with high yield. In a semiconductor device including the transistor in which an oxide semiconductor film, a gate insulating film, and a gate electrode layer are stacked in this order, a first sidewall insulating layer is provided in contact with a side surface of the gate electrode layer, and a second sidewall insulating layer is provided to cover a side surface of the first sidewall insulating layer. The first sidewall insulating layer is an aluminum oxide film in which a crevice with an even shape is formed on its side surface. The second sidewall insulating layer is provided to cover the crevice. A source electrode layer and a drain electrode layer are provided in contact with the oxide semiconductor film and the second sidewall insulating layer.

12 Claims, 16 Drawing Sheets

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0224878 A1 | 9/2010 | Kimura |
| 2011/0089414 A1 | 4/2011 | Yamazaki et al. |
| 2011/0114943 A1 | 5/2011 | Yamazaki et al. |
| 2011/0147738 A1 | 6/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 A | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 36, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 7, 1996, vol. 68, No. 25, pp. 3850-3652.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector with Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption echnologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependenc of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Drive-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Diges of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic NANO-Structured Liquid Crystal Composites for Display Applications" SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW'06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid 2, Crystal Blue Phases", Nature Materials, Sep. 2, 2002, vol. 1, pp. 64-68.

(56) References Cited

OTHER PUBLICATIONS

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, p. 122102-1-122102-3.

Oba.F et al., "Detect energetics in ZnO: A hybrid Hartree-Fock density functionality study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur.Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to properties", J. Vac. Sci. Technol. B (Journal of Vaccum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

SEMICONDUCTOR DEVICE AND MANUFACTURING METHOD THEREOF

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

Attention has been focused on a technique for forming a transistor using a semiconductor thin film formed over a substrate having an insulating surface (also referred to as a thin film transistor, TFT). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including a semiconductor layer formed using an amorphous oxide containing indium (In), gallium (Ga), and zinc (Zn) (In—Ga—Zn—O-based amorphous oxide) is disclosed (see Patent Document 1).

REFERENCE

Patent Document

[Patent Document 1] Japanese Published Patent Application No. 2011-181801

SUMMARY OF THE INVENTION

In order to achieve high-speed operation, low power consumption, high integration, or the like of a transistor, it is necessary to miniaturize a transistor.

An object of an embodiment of the present invention is to provide a structure of a semiconductor device which achieves high-speed response and high-speed operation by improving on-state characteristics (e.g., on-state current or field-effect mobility) of a miniaturized transistor, and to provide a manufacturing method of the semiconductor device, in order to achieve a high-performance semiconductor device.

Another object of an embodiment of the present invention is to impart stable electrical characteristics to a semiconductor device including a transistor including an oxide semiconductor film.

Further, with the miniaturization of the transistor, concern about a decrease in yield of a manufacturing process rises.

Another object of an embodiment of the present invention is to provide a miniaturized transistor having high electrical characteristics with high yield.

Further, another object of an embodiment of the present invention is to achieve high performance, high reliability, and high productivity also of a semiconductor device including the transistor.

In a semiconductor device including a transistor in which an oxide semiconductor film, a gate insulating film, and a gate electrode layer are stacked in this order, a first sidewall insulating layer is provided in contact with a side surface of the gate electrode layer and top surface of the gate insulating film, and a second sidewall insulating layer is provided to cover a side surface of the first sidewall insulating layer. The first sidewall insulating layer comprising a portion to cover the side surface of the gate electrode and a portion to cover the top surface of the gate insulating film includes a crevice with an uneven shape between the both portions, when the first sidewall is made of an aluminum oxide. The second sidewall insulating layer is provided so as to form even surface to cover the crevice over the first sidewall insulating layer. A source electrode layer and a drain electrode layer are provided in contact with the oxide semiconductor film and the second sidewall insulating layer.

The second sidewall insulating layer can prevent electrical defects such as a short circuit and a leakage current between the gate electrode layer and the source and drain electrode layers. Further, the first sidewall insulating layer formed of an aluminum oxide film can supply oxygen to the oxide semiconductor film and suppress release of oxygen and entry of impurities such as hydrogen.

In a process for manufacturing the semiconductor device, a conductive film and an interlayer insulating film are stacked to cover the oxide semiconductor film, the first sidewall insulating layer, the second sidewall insulating layer, and the gate electrode layer. Then, the interlayer insulating film and the conductive film are cut (grinded or polished), so that part of the conductive film over the gate electrode layer is removed. Accordingly, the source electrode layer and the drain electrode layer are formed. As the cutting (grinding or polishing) method, a chemical mechanical polishing (CMP) method can be preferably used.

Precise processing can be performed accurately because an etching step using a resist mask is not performed in the step of removing the conductive film over the gate electrode layer, which is one step of the formation process of the source electrode layer and the drain electrode layer. Consequently, in a process for manufacturing the semiconductor device, a miniaturized transistor with less variation in shape or characteristics can be manufactured with high yield.

An insulating film may be provided over the gate electrode layer. Part or all of the insulating film may be removed in the step of removing the conductive film which is to be a source electrode layer and a drain electrode layer and provided over the insulating film.

Low-resistance regions whose resistances are lower than that of the channel formation region and which include a dopant are formed in the oxide semiconductor film so that the channel formation region is sandwiched between the low-resistance regions, by introducing the dopant into the oxide semiconductor film in a self-aligned manner using the gate electrode layer as a mask. The dopant is an impurity by which the electrical conductivity of the oxide semiconductor film is changed. As the method for introducing the dopant, an ion implantation method, an ion doping method, a plasma immersion ion implantation method, or the like can be used.

With the oxide semiconductor film including the low-resistance regions between which the channel formation region is provided in the channel length direction, on-state characteristics (e.g., on-state current and field-effect mobility) of the transistor are increased, which enables high-speed operation and high-speed response of the transistor.

Accordingly, a miniaturized transistor having high and stable electrical characteristics can be provided with high yield. Further, also in a semiconductor device including the transistor, high performance, high reliability, and high productivity can be achieved.

An embodiment of the present invention is a semiconductor device including an oxide semiconductor film including a channel formation region and provided over an oxide insulating film; a gate insulating film over the oxide semiconductor film; a gate electrode layer over the gate insulating film; a first sidewall insulating layer covering part of a top surface of the gate insulating film and a side surface of the gate electrode layer; a second sidewall insulating layer covering a side surface of the first sidewall insulating layer; a source electrode layer and a drain electrode layer in contact with the oxide semiconductor film, a side surface of the gate insulating film, and a side surface of the second sidewall insulating layer; and an interlayer insulating film over the source electrode layer and the drain electrode layer. The first sidewall insulating layer is an aluminum oxide film in which a crevice is formed on its side surface. In the oxide semiconductor film, a region not overlapping with the gate electrode layer contains a dopant.

In the above structure, an oxide insulating film (e.g., a silicon oxynitride film) is preferably used as the second sidewall insulating layer. A nitride insulating film may be provided between the gate electrode layer and the interlayer insulating film.

In addition, in the oxide semiconductor film, a region which does not overlap with the source electrode layer or the drain electrode layer may have a higher oxygen concentration than a region which overlaps with the source electrode layer or the drain electrode layer.

An embodiment of the present invention is a manufacturing method of a semiconductor device including the steps of: forming a first oxide insulating film; forming an oxide semiconductor film over the first oxide insulating film; forming an insulating film over the oxide semiconductor film; forming a gate electrode layer overlapping with the oxide semiconductor film over the insulating film; introducing a dopant into the oxide semiconductor film using the gate electrode layer as a mask; forming an aluminum oxide film over the insulating film and the gate electrode layer; forming a second oxide insulating film over the aluminum oxide film; etching the second oxide insulating film, thereby an oxide insulating layer covering a side surface of the gate electrode layer with the aluminum oxide film provided therebetween is formed; etching the aluminum oxide film using the gate electrode layer and the oxide insulating layer as masks, thereby a first sidewall insulating layer are formed; forming a third oxide insulating film over the oxide semiconductor film, the gate electrode layer, and the first sidewall insulating layer; etching the third oxide insulating film and the insulating film, thereby a second sidewall insulating layer covering a side surface of the first sidewall insulating layer and a gate insulating film is formed over the gate insulating film; forming a conductive film over the oxide semiconductor film, the gate insulating film, the gate electrode layer, the first sidewall insulating layer, and the second sidewall insulating layer; forming an interlayer insulating film over the conductive film; and removing part of the interlayer insulating film and the conductive film by a chemical mechanical polishing method so that the gate electrode layer is exposed and the conductive film is divided, thereby a source electrode layer and a drain electrode layer are formed. In the method, the oxide insulating layer disappears in the step of etching the aluminum oxide film and the insulating film.

In the above method, the aluminum oxide film can be formed by a sputtering method. Further, the third oxide insulating film can be formed by a deposition method using a deposition gas. For example, a chemical vapor deposition (CVD) method can be used.

In addition to the cutting (grinding or polishing) method such as a chemical mechanical polishing method, etching (dry etching or wet etching) method, plasma treatment, or the like may be employed in combination in the step of removing the conductive film over the gate electrode layer. For example, after the removing step by a chemical mechanical polishing method, a dry etching method or plasma treatment may be performed in order to improve the planarity of a surface to be processed.

In the above structure, planarization treatment may be performed on a surface of the oxide insulating film over which the oxide semiconductor film is to be formed. The oxide semiconductor film having small thickness can be provided with good coverage. As the planarization treatment, a chemical mechanical polishing method, an etching method, plasma treatment, or the like or a combination of these can be employed.

In the above structure, heat treatment may be performed after the aluminum oxide film is formed. The heat treatment may be performed at a temperature higher than or equal to the temperature at which the aluminum oxide film is formed.

In addition, heat treatment by which hydrogen or moisture is eliminated from the oxide semiconductor film (dehydration or dehydrogenation treatment) may be performed on the oxide semiconductor film. When a crystalline oxide semiconductor film is used as the oxide semiconductor film, heat treatment for crystallization may be performed.

An embodiment of the present invention relates to a semiconductor device including a transistor or a semiconductor device including a circuit which is formed by using a transistor. For example, an embodiment of the present invention relates to a semiconductor device including a transistor in which a channel formation region is formed using an oxide semiconductor or a semiconductor device including a circuit which is formed by using such a transistor. For example, the present invention relates to an electronic device which includes, as a component, a semiconductor integrated circuit including an LSI, a CPU, a power device mounted in a power circuit, a memory, a thyristor, a converter, an image sensor, or the like, or a light-emitting display device including a light-emitting element or an electro-optical device typified by a liquid crystal display panel.

Accordingly, a miniaturized transistor having high electrical characteristics can be provided with high yield.

Further, also in a semiconductor device including the transistor, high performance, high reliability, and high productivity can be achieved.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, an embodiment of a semiconductor device and a method for manufacturing the semiconductor device are described with reference to FIGS. 1A and 1B. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 1A:
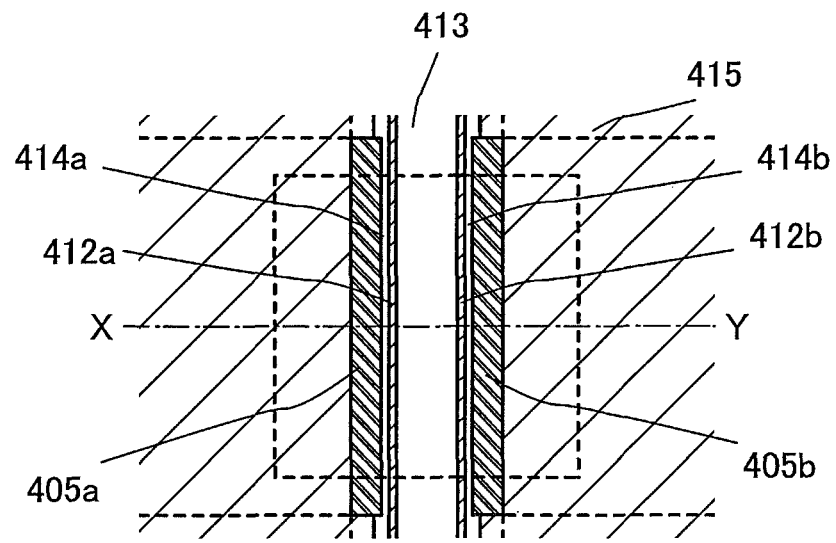
FIGS. 1A and 1B are a plan view and cross-sectional views which illustrate an embodiment of a semiconductor device.
Figure 1B:
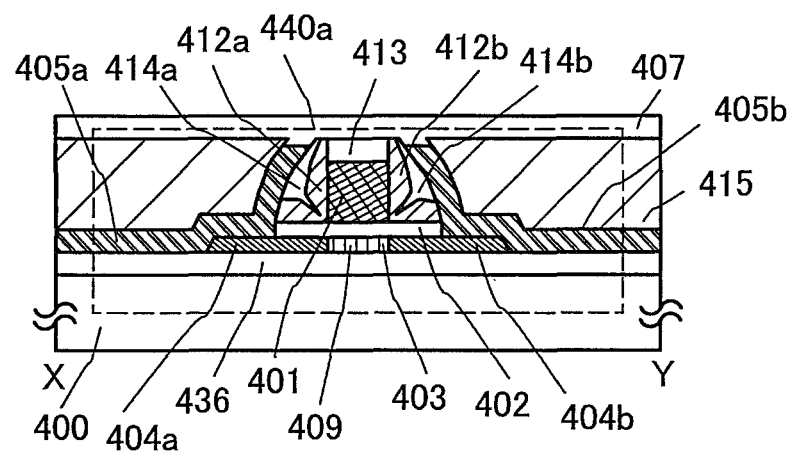

A transistor 440a illustrated in FIGS. 1A and 1B is an example of a top-gate transistor. FIG. 1A is a plan view and FIG. 1B is a cross-sectional view along dashed line X-Y in FIG. 1A.

As illustrated in FIG. 1B, which is a cross-sectional view in the channel length direction, a semiconductor device including the transistor 440a includes, over a substrate 400 having an insulation surface over which an oxide insulating film 436 is provided, an oxide semiconductor film 403 including a channel formation region 409 and low-resistance regions 404a and 404b, a source electrode layer 405a, a drain electrode layer 405b, a gate insulating film 402, a gate electrode layer 401, first sidewall insulating layers 412a and 412b provided in contact with side surfaces of the gate electrode layer 401, second sidewall insulating layers 414a and 414b provided so as to cover crevices on side surfaces of the first sidewall insulating layers 412a and 412b, an insulating film 413 provided over the gate electrode layer 401, an interlayer insulating film 415 provided over the source electrode layer 405a and the drain electrode layer 405b, and an insulating film 407 covering the transistor 440a.

Note that in the cross section of the transistor 440a in the channel length direction, the first sidewall insulating layers 412a and 412b are provided so as to cover from a top surface of the gate electrode layer 401 to an edge of the gate insulating film 402, and the side surface of the first sidewall insulating layers 412a and 412b have crevices at the steps formed of the gate insulating film 402 and the gate electrode layer 401.

The first sidewall insulating layers 412a and 412b are aluminum oxide films having crevices on the side surfaces. The second sidewall insulating layers 414a and 414b are provided so as to cover the crevices and even the side surfaces.

In this embodiment, an aluminum oxide film is used as the first sidewall insulating layers 412a and 412b. With an aluminum oxide film having a high density (film density higher than or equal to 3.2 g/cm$^3$, preferably higher than or equal to 3.6 g/cm$^3$), the transistor 440a can have stable electrical characteristics. The film density can be measured by Rutherford backscattering spectrometry (RBS) or X-ray reflection (XRR). The aluminum oxide film preferably contains an amount of oxygen which exceeds at least the amount of oxygen in the stoichiometric composition in the film (bulk). For example, the composition of the aluminum oxide film may be AlOx (x>1.5).

An aluminum oxide film which can be used for the first sidewall insulating layers 412a and 412b has a superior shielding effect (blocking effect), which is not permeable to oxygen and impurities such as hydrogen or moisture.

Therefore, during the manufacturing process and after the manufacture, the first sidewall insulating layers 412a and 412b function as a protective film for preventing entry of impurities such as hydrogen and moisture which might cause variation in characteristics into the oxide semiconductor film 403 and release of oxygen which is a main component of the oxide semiconductor from the oxide semiconductor film 403. Further, an aluminum oxide film can supply oxygen to the oxide semiconductor film 403 which is in contact with the aluminum oxide film.

However, it takes time to deposit an aluminum oxide film with a large thickness and etching for processing the film also takes time, so that the process becomes complex and productivity is lowered.

In this embodiment, a thin aluminum oxide film is used as the first sidewall insulating layers 412a and 412b. In the first sidewall insulating layers 412a and 412b which are thin films, a portion with poor coverage such as a crevice is often formed at a step in the vicinity where the gate electrode layer 401 is in contact with the gate insulating film 402. When the source electrode layer 405a and the drain electrode layer 405b are provided in contact with such first sidewall insulating layers 412a and 412b with poor coverage, electrical defects such as a short circuit and a leakage current might be caused between the gate electrode layer 401 and the source and drain electrode layers 405a and 405b.

As described in this embodiment, the second sidewall insulating layers 414a and 414b are provided so as to cover the poor coverage of the first sidewall insulating layers 412a and 412b; thus, the side surfaces of the gate electrode layer 401 can be covered with the sidewall insulating layers with good coverage.

Accordingly, the sidewall insulating layers formed by stacking the first sidewall insulating layers 412a and 412b and the second sidewall insulating layers 414a and 414b can be formed without decreasing productivity.

Therefore, when the sidewall insulating layers formed by stacking the first sidewall insulating layers 412a and 412b and the second sidewall insulating layers 414a and 414b are provided, electrical defects such as a short circuit and a leakage current between the gate electrode layer 401 and the source and drain electrode layers 405a and 405b can be prevented by the second sidewall insulating layers 414a and 414b. In addition, oxygen can be supplied into the oxide semiconductor film 403 and oxygen release and entry of impurities such as hydrogen can be suppressed by the first sidewall insulating layers 412a and 412b formed of an aluminum oxide film.

In an example described in this embodiment, the height of the top surface of the interlayer insulating film 415 is substantially the same as the height of the top surfaces of the first sidewall insulating layers 412a and 412b, the second sidewall insulating layers 414a and 414b, and the insulating film 413; the height of top surfaces of the source electrode layer 405a and the drain electrode layer 405b is lower than the height of the top surfaces of the interlayer insulating film 415, the first sidewall insulating layers 412a and 412b, the second sidewall insulating layers 414a and 414b, and the insulating film 413 and is higher than that of the gate electrode layer 401. Note that "height" here means a distance from the top surface of the substrate 400.

Further, in FIGS. 1A and 1B, the insulating film 407 is provided in contact with the interlayer insulating film 415, the source electrode layer 405a, the drain electrode layer 405b, the first sidewall insulating layers 412a and 412b, the second sidewall insulating layers 414a and 414b, and the insulating film 413.

A dopant is introduced into the oxide semiconductor film 403 in a self-aligned manner using the gate electrode layer 401 as a mask, so that the low-resistance regions 404a and 404b between which the channel formation region 409 is sandwiched, which have lower resistances than the channel formation region 409, and which include a dopant are formed in the oxide semiconductor film 403. The dopant is an impurity which changes the conductivity of the oxide semiconductor film 403. As the method for introducing the dopant, an ion implantation method, an ion doping method, a plasma immersion ion implantation method, or the like can be used.

With the oxide semiconductor film 403 including the low-resistance regions 404a and 404b between which the channel formation region 409 is provided in the channel length direction, on-state characteristics (e.g., on-state current and field-effect mobility) of the transistor 440a are increased, which enables high-speed operation and high-speed response of the transistor.

An oxide semiconductor used for the oxide semiconductor film 403 contains at least indium (In). In particular, In and zinc (Zn) are preferably contained. As a stabilizer for reducing variation in electrical characteristics of a transistor including the oxide semiconductor film, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Without limitation to the above materials, a material with an appropriate composition may be used as the oxide semiconductor containing indium depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor film 403 can be in a single crystal state, a polycrystalline (also referred to as polycrystal) state, an amorphous state, or the like.

Preferably, a CAAC-OS (c-axis aligned crystalline oxide semiconductor) film can be used as the oxide semiconductor film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film in a transistor, change in electrical characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that, Ra is obtained by three-dimension expansion of arithmetic average roughness that is defined by JIS B 0601: 2001 (ISO4287:1997) so as to be applied to a curved plane. The Ra can be expressed as an "average value of the absolute values of deviations from a reference surface to a specific surface" and is defined by the formula below.

[FORMULA 1]

$$Ra = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. The area of a rectangle which is obtained by projecting the specific surface on the xy plane is represented by $S_0$, and the height of the reference surface (the average height of the specific surface) is represented by $Z_0$. Ra can be measured using an atomic force microscope (AFM).

Note that since the transistor 440 (440a, 440b, and 440c) described in this embodiment is a bottom-gate transistor, the substrate 400, the gate electrode layer 401, and the gate insulating film 402 are located below the oxide semiconductor film. Accordingly, planarization treatment such as CMP treatment may be performed after the formation of the gate electrode layer 401 and the gate insulating film 402 to obtain the above flat surface.

The oxide semiconductor film 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor film 403 may be formed with a sputtering apparatus which performs deposition in the state where top surfaces of a plurality of substrates are substantially perpendicular to a top surface of a sputtering target.

An example of a method for manufacturing a semiconductor device including the transistor 440a is described with reference to FIGS. 2A to 2E and FIGS. 3A to 3E.

First, the oxide insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440a including the oxide semiconductor film 403 may be directly formed over a flexible substrate; or alternatively, the transistor 440a including the oxide semiconductor film 403 may be formed over a substrate, and then may be separated and transferred to a flexible substrate. To separate the transistor 440a from the substrate and transfer to the flexible substrate, a separation layer may be provided between the substrate and the transistor 440a including the oxide semiconductor film.

The oxide insulating film 436 can be formed by a plasma CVD method, a sputtering method, or the like, using silicon oxide, silicon oxynitride, aluminum oxide, aluminum oxynitride, hafnium oxide, gallium oxide, or a mixed material of any of these materials.

The oxide insulating film 436 may have either a single-layer structure or a stacked-layer structure. For example, a silicon oxide film, an In—Hf—Zn-based oxide film, and the oxide semiconductor film 403 may be stacked in that order over the substrate 400; a silicon oxide film, an In—Zr—Zn-based oxide film with an atomic ratio of In:Zr:Zn=1:1:1, and the oxide semiconductor film 403 may be stacked in that order over the substrate 400; or a silicon oxide film, an In—Gd—Zn-based oxide film with an atomic ratio of In:Gd:Zn=1:1:1, and the oxide semiconductor film 403 may be stacked in that order over the substrate 400.

In this embodiment, a silicon oxide film formed by a sputtering method as the oxide insulating film 436 is used.

Further, a nitride insulating film may be provided between the oxide insulating film 436 and the substrate 400. The nitride insulating film can be formed by a plasma CVD method, a sputtering method, or the like with the use of silicon nitride, silicon nitride oxide, aluminum nitride, or aluminum nitride oxide, or a mixed material of any of these materials.

The oxide insulating film 436, which is in contact with the oxide semiconductor film 403, preferably contains a large amount of oxygen which exceeds at least the amount of oxygen in the stoichiometric composition in the film (bulk). For example, in the case where a silicon oxide film is used as the oxide insulating film 436, the composition formula is $SiO_{2+\alpha}$ ($\alpha>0$). By using the oxide insulating film 436 described above, oxygen can be supplied to the oxide semiconductor film 403 and favorable characteristics can be obtained. By a supply of oxygen to the oxide semiconductor film 403, oxygen vacancies in the film can be filled.

For example, when the oxide insulating film 436 containing much (excess) oxygen, which serves as an oxygen supply source, is provided to be in contact with the oxide semiconductor film 403, oxygen can be supplied from the oxide insulating film 436 to the oxide semiconductor film 403. The oxide semiconductor film 403 and the oxide insulating film 436 may be subjected to heat treatment in a state where the oxide semiconductor film 403 and the oxide insulating film 436 are at least partly in contact with each other so that oxygen is supplied to the oxide semiconductor film 403.

Planarization treatment may be performed on a region of the oxide insulating film 436 which is in contact with the oxide semiconductor film 403. As the planarization treatment, polishing treatment (e.g., a chemical mechanical polishing method), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the oxide insulating film 436.

As the planarization treatment, polishing treatment, dry etching treatment, or plasma treatment may be performed plural times, or these treatments may be performed in combination. In the case where the treatments are combined, the order of steps is not particularly limited and may be set as appropriate in accordance with roughness of the surface of the oxide insulating film 436.

Planarization treatment may be performed on a surface of the silicon oxide film used as the oxide insulating film 436 by a chemical mechanical polishing method (the polishing conditions: a polyurethane-based polishing cloth, silica-based slurry, a slurry temperature of room temperature, a polishing pressure of 0.001 MPa, a rotation number in polishing (table/spindle) of 60 rpm/56 rpm, and a polishing time of 0.5 minutes) so that the average surface roughness (Ra) of the surface of the silicon oxide film is preferably approximately 0.15 nm.

Next, the oxide semiconductor film 403 is formed over the oxide insulating film 436.

In order that hydrogen or water is not contained in the oxide semiconductor film 403 as much as possible in the formation process of the oxide semiconductor film 403, it is preferable to heat the substrate provided with the oxide insulating film 436 in a preheating station of a sputtering apparatus as a pretreatment for formation of the oxide semiconductor film 403 so that impurities such as hydrogen and moisture adsorbed to the substrate and the oxide insulating film 436 are eliminated and evacuated. As an exhaustion unit provided in the preheating station, a cryopump is preferable.

In order to reduce impurities such as hydrogen including water and a hydroxyl group and make the oxide insulating film 436 an oxygen-excess film, heat treatment (dehydration or dehydrogenation) to remove hydrogen including water and a hydroxyl group and/or oxygen doping treatment may be performed on the oxide insulating film 436. The dehydration or dehydrogenation and the oxygen doping treatment each may be performed plural times, and may be combined and repeated.

It is preferable that the oxide semiconductor film 403 contains oxygen in a proportion higher than that in the stoichiometric composition to be supersaturated shortly after the oxide semiconductor film 403 is deposited. For example, in the case where the oxide semiconductor film 403 is formed by a sputtering method, deposition is preferably performed under such a condition that the ratio of oxygen to a deposition gas is high. In particular, deposition is preferably performed in an oxygen atmosphere (100% oxygen gas). The deposition under the condition where the proportion of oxygen in a deposition gas is large, in particular, in an atmosphere containing an oxygen gas at 100% can suppress the release of Zn from the film even when the deposition temperature is, for example, higher than or equal to 300° C.

In addition, the oxide semiconductor film 403 is supersaturated with oxygen by being supplied with enough oxygen; thus, the insulating films in contact with the oxide semiconductor film 403 (the plurality of insulating films provided so as to surround the oxide semiconductor film 403) preferably contain excess oxygen.

Note that in this embodiment, a target used for forming the oxide semiconductor film 403 by a sputtering method is, for example, an oxide target having a composition of In:Ga:Zn=3:1:2 [atomic percentage], so that an In—Ga—Zn-based oxide film (IGZO film) is formed.

The relative density (the fill rate) of the metal oxide target is 90% to 100% inclusive, preferably 95% to 99.9% inclusive. By using the metal oxide target with high relative density, a dense oxide semiconductor film can be formed.

It is preferable that a high-purity gas from which impurities such as hydrogen, water, a hydroxyl group, or hydride are removed be used as a sputtering gas for the formation of the oxide semiconductor film 403.

The substrate is held in a deposition station kept under reduced pressure. Then, a sputtering gas in which impurities such as hydrogen and moisture are sufficiently removed is introduced into the deposition station from which remaining moisture is being removed, and the oxide semiconductor film 403 is formed over the substrate 400 with the use of the target. In order to remove moisture remaining in the deposition station, an entrapment vacuum pump such as a cryopump, an ion pump, or a titanium sublimation pump is preferably used. As an exhaustion unit, a turbo molecular pump to which a cold trap is added may be used. In the deposition station which is evacuated with the cryopump, for example, a hydrogen atom, a compound containing a hydrogen atom, such as water ($H_2O$), (further preferably, also a compound containing a carbon atom), and the like are removed, whereby the concentration of impurities in the oxide semiconductor film 403 formed in the deposition station can be reduced.

The oxide insulating film 436 and the oxide semiconductor film 403 are preferably formed in succession without exposure to the air. Through successive formation of the oxide insulating film 436 and the oxide semiconductor film 403 without exposure to the air, impurities such as hydrogen and moisture can be prevented from being adsorbed onto the surface of the oxide insulating film 436.

The oxide semiconductor film 403 can be formed by processing a film-shaped oxide semiconductor film into an island shape by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. Alternatively, ITO-07N (produced by KANTO CHEMICAL CO., INC.) may be used. Further alternatively, the oxide semiconductor film may be etched by a dry etching method using an inductively coupled plasma (ICP) etching method. For example, an IGZO film is etched by the ICP etching method (the etching conditions: an etching gas ($BCl_3$:$Cl_2$=60 sccm:20 sccm), a power of 450 W, a bias power of 100 W, and a pressure of 1.9 Pa), so that the IGZO film is processed into an island shape.

It is preferable that the oxide semiconductor film 403 be highly purified to contain few impurities such as copper, aluminum, and chlorine. In the process for manufacturing the transistor 440a, steps in which these impurities are not mixed or attached to the surface of the oxide semiconductor film 403 are preferably selected as appropriate. In the case where the impurities are attached to the surface of the oxide semiconductor film 403, the impurities on the surface of the oxide semiconductor film 403 are preferably removed by exposure to oxalic acid or dilute hydrofluoric acid or plasma treatment (such as $N_2O$ plasma treatment). Specifically, the concentration of copper in the oxide semiconductor film 403 is lower than or equal to $1\times10^{18}$ atoms/cm$^3$, preferably lower than or equal to $1\times10^{17}$ atoms/cm$^3$. Further, the concentration of aluminum in the oxide semiconductor film 403 is lower than or equal to $1\times10^{18}$ atoms/cm$^3$. Further, the concentration of chlorine in the oxide semiconductor film 403 is lower than or equal to $2\times10^{18}$ atoms/cm$^3$.

Further, heat treatment may be performed on the oxide semiconductor film 403 in order to remove excess hydrogen including water and a hydroxyl group (to perform dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is one of heat treatment apparatuses, and the oxide semiconductor film 403 is subjected to heat treatment at 450° C. for one hour in a nitrogen atmosphere.

Further, a heat treatment apparatus is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in the heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the $N_2O$ gas acts to supply oxygen that is a main constituent material of the oxide semiconductor and that is reduced by the step for removing an impurity for dehydration or dehydrogenation, so that the oxide semiconductor film 403 can be a high-purified, electrically i-type (intrinsic) oxide semiconductor film.

Note that the heat treatment for dehydration or dehydrogenation may be performed after the formation of the oxide semiconductor film 491 in film shape or after the formation of the island-shaped oxide semiconductor film 403.

The heat treatment for dehydration or dehydrogenation may be performed plural times and may be combined with another heat treatment.

When the heat treatment for dehydration or dehydrogenation is performed in the state where the oxide insulating film 436 is covered with the film-shaped oxide semiconductor film 403 which has not been processed into the island-shaped oxide semiconductor film 403, oxygen contained in the oxide insulating film 436 can be prevented from being released by the heat treatment, which is preferable.

An oxygen vacancy exists in a portion where oxygen is eliminated in an oxide semiconductor film, and a donor level which leads to a change in the electrical characteristics of a transistor is formed owing to the oxygen vacancy. The dehydration or dehydrogenation treatment may accompany elimination of oxygen which is a main constituent material of an oxide semiconductor to lead to a reduction in oxygen.

Thus, oxygen is preferably supplied to the oxide semiconductor film 403 in the case where the dehydration or dehydrogenation treatment is performed. By a supply of oxygen to the oxide semiconductor film 403, oxygen vacancies in the film can be filled.

Accordingly, dehydration or dehydrogenation treatment is preferably performed before the addition of oxygen to the oxide semiconductor film 403.

An oxide insulating film containing much (excessive) oxygen, which serves as an oxygen supply source, may be provided so as to be in contact with the oxide semiconductor film 403, whereby oxygen can be supplied from the oxide insulating film to the oxide semiconductor film 403. In the above structure, heat treatment may be performed in the state where the oxide semiconductor film 403 which has been subjected to the heat treatment and the oxide insulating film are at least partly in contact with each other to supply oxygen to the oxide semiconductor film.

Oxygen (which includes at least one or more of an oxygen radical, an oxygen atom, an oxygen molecule, ozone, an oxygen ion, an oxygen molecule ion, and an oxygen cluster ion) may be introduced by oxygen doping treatment into the oxide semiconductor film 403 after being subjected to the dehydration or dehydrogenation treatment to be supplied to the film. Oxygen doping includes "oxygen plasma doping" in which oxygen plasma is added to a bulk.

A gas containing oxygen can be used for oxygen doping treatment. As the gas containing oxygen, oxygen, dinitrogen monoxide, nitrogen dioxide, carbon dioxide, carbon monoxide, and the like can be used. Further, a rare gas may be used for oxygen doping treatment.

The oxygen (an oxygen radical, an oxygen atom, an oxygen molecule, ozone, an oxygen ion, an oxygen molecule ion, and/or an oxygen cluster ion) can be added by an ion implantation method, an ion doping method, a plasma immersion ion implantation method, plasma treatment, or the like. A gas cluster ion beam may be used for an ion implantation method. Oxygen doping treatment may be performed on the entire surface at a time or may be performed by moving (scanning) the object with linear ion beam or the like.

For example, in the case where an oxygen ion is introduced by an ion implantation method as oxygen doping treatment, the dosage can be greater than or equal to $1 \times 10^{13}$ ions/cm$^2$ and less than or equal to $5 \times 10^{16}$ ions/cm$^2$.

The oxide semiconductor film 403 is preferably purified by sufficient removal of impurities such as hydrogen or by supersaturation with oxygen by sufficient supply of oxygen. Specifically, the hydrogen concentration in the oxide semiconductor film 403 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the hydrogen concentration in the oxide semiconductor film 403 is measured by secondary ion mass spectrometry (SIMS).

Further, it is preferable that impurities such as hydrogen be sufficiently removed from the insulating films (the oxide insulating film 436, the gate insulating film 442, and the interlayer insulating film 415) in contact with the oxide semiconductor film 403. Specifically, hydrogen concentration in the insulating films in contact with the oxide semiconductor film 403 is preferably lower than $7.2 \times 10^{20}$ atoms/cm$^3$.

In order to reduce impurities such as hydrogen including water and a hydroxyl group and make the gate insulating film 442 an oxygen-excess film, heat treatment (dehydration or dehydrogenation) to remove hydrogen including water and a hydroxyl group and/or oxygen doping treatment may be performed on the gate insulating film 442. The dehydration or dehydrogenation and the oxygen doping treatment each may be performed plural times, and may be combined and repeated.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film for a transistor, fluctuation in the threshold voltage Vth of the transistor due to an oxygen vacancy and a shift of the threshold voltage ΔVth can be reduced.

Next, the gate insulating film 442 covering the oxide semiconductor film 403 is formed.

To improve the coverage with the gate insulating film 442, the above-described planarization treatment may be performed also on the surface of the oxide semiconductor film 403. It is preferable that the flatness of the surface of the oxide semiconductor film 403 be good particularly when the thickness of the gate insulating film 442 is small.

The gate insulating film 442 has a thickness greater than or equal to 1 nm and less than or equal to 20 nm and can be formed by a sputtering method, an MBE method, a CVD method, a pulse laser deposition method, an ALD method, or the like as appropriate. The gate insulating film 442 may also be formed with a sputtering apparatus which performs deposition in the state where surfaces of a plurality of substrates are substantially perpendicular to a surface of a sputtering target.

The gate insulating film 442 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 442 include oxygen in a portion which is in contact with the oxide semiconductor film 403. In particular, the gate insulating film 442 preferably contains a large amount of oxygen which exceeds at least the amount of oxygen in the stoichiometric ratio in the film (bulk). For example, in the case where a silicon oxide film is used as the gate insulating film 442, the composition formula is $SiO_{2+\alpha}$ ($\alpha>0$). In this embodiment, a silicon oxide film of $SiO_{2+\alpha}$ ($\alpha>0$) is used as the gate insulating film 442. By using the silicon oxide film as the gate insulating film 442, oxygen can be supplied to the oxide semiconductor film 403, leading to good characteristics. Further, the gate insulating film 442 is preferably formed in consideration of the size of a transistor to be formed and the step coverage with the gate insulating film 442.

When the gate insulating film 442 is formed using a high-k material such as hafnium oxide, yttrium oxide, hafnium silicate ($HfSi_xO_y$ ($x>0$, $y>0$)), hafnium silicate ($HfSi_xO_y$ ($x>0$, $y>0$)) to which nitrogen is added, hafnium aluminate ($HfAl_xO_y$ ($x>0$, $y>0$)), or lanthanum oxide, gate leakage current can be reduced. Further, the gate insulating film 442 has either a single-layer structure or a stacked-layer structure.

Figure 2A:
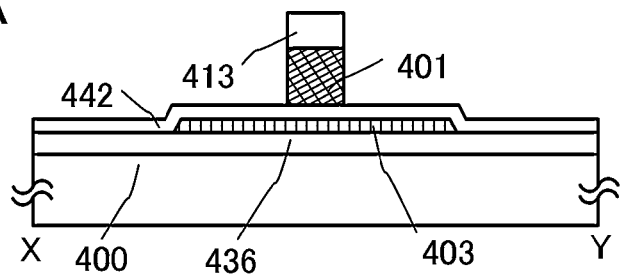
FIGS. 2A to 2E are cross-sectional views illustrating an embodiment of a method for manufacturing a semiconductor device.

Next, stacked layers of the conductive film and the insulating film are formed over the gate insulating film 442 and are etched, so that stacked layers of the gate electrode layer 401 and the insulating film 413 are formed (see FIG. 2A).

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 442, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to take a positive value when used as the gate electrode layer, so that a switching element of so-called normally-off type can be realized.

The insulating film 413 can be formed using an inorganic insulating film such as a silicon nitride film, an aluminum nitride film, a silicon nitride oxide film, an aluminum nitride oxide film, a silicon oxide film, a silicon oxynitride film, an aluminum oxide film, an aluminum oxynitride film. The insulating film 413 can be formed by a plasma CVD method, a sputtering method, or the like.

Figure 2B:
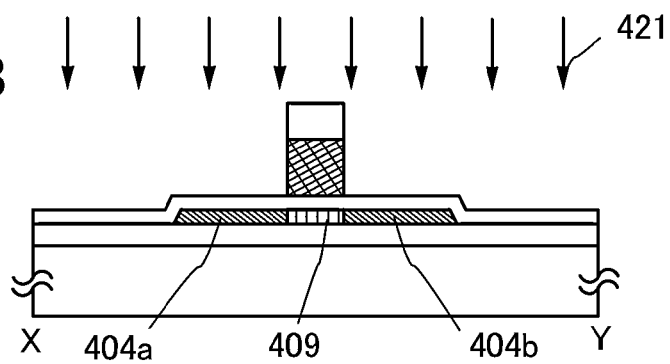

Next, a dopant 421 is introduced into the oxide semiconductor film 403 using the gate electrode layer 401 and the insulating film 413 as masks, whereby the low-resistance regions 404a and 404b are formed (see FIG. 2B).

The dopant 421 is an impurity by which the electrical conductivity of the oxide semiconductor film 403 is changed. One or more selected from the following can be used as the dopant 421: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

Alternatively, the dopant 421 can be introduced into the oxide semiconductor film 403 through another film (e.g., the gate insulating film 402) by an implantation method. As the method for introducing the dopant 421, an ion implantation method, an ion doping method, a plasma immersion ion implantation method, or the like can be used. In that case, it is preferable to use a single ion of the dopant 421, or a fluoride ion or chloride ion thereof.

The introduction of the dopant 421 may be controlled by setting the addition conditions such as the accelerated voltage and the dosage, or the thickness of the films through which the dopant passes as appropriate. In this embodiment, phosphorus is used as the dopant 421, whose ion is added by an ion implantation method. Note that the dosage of the dopant 421 may be greater than or equal to $1 \times 10^{13}$ ions/cm$^2$ and less than or equal to $5 \times 10^{16}$ ions/cm$^2$.

The concentration of the dopant 421 in the low-resistance region is preferably greater than or equal to $5 \times 10^{18}$/cm$^3$ and less than or equal to $1 \times 10^{22}$/cm$^3$.

The dopant 421 may be introduced while the substrate 400 is heated.

The addition of the dopant 421 into the oxide semiconductor film 403 may be performed plural times, and the number of kinds of dopant may be plural.

Further, heat treatment may be performed thereon after the addition of the dopant 421. The heat treatment is preferably performed at a temperature higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

In this embodiment, phosphorus (P) ions are introduced into the oxide semiconductor film 403 by an ion implantation method. Note that the conditions of the phosphorus (P) ion implantation are as follows: the acceleration voltage is 30 kV and the dosage is $1.0 \times 10^{15}$ ions/cm$^2$.

When the oxide semiconductor film 403 is a CAAC-OS film, the oxide semiconductor film 403 is partly amorphized by introduction of the dopant 421 in some cases. In that case, the crystallinity of the oxide semiconductor film 403 can be recovered by performing heat treatment thereon after the introduction of the dopant 421.

Thus, the oxide semiconductor film 403 in which the low-resistance regions 404a and 404b between which the channel formation region 409 is sandwiched are formed.

Figure 2C:
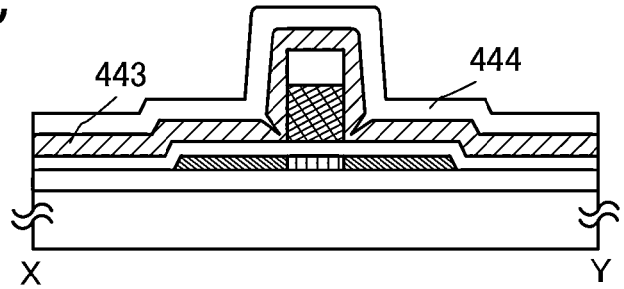

Next, an insulating film 443 is formed over the gate electrode layer 401 and the insulating film 413, and then, an insulating film 444 is stacked over the insulating film 443 (see FIG. 2C).

An aluminum oxide film is used as the insulating film 443. The insulating film 443 can be formed by a plasma CVD method, a sputtering method, an evaporation method, or the like.

In this embodiment, an aluminum oxide film is formed by a sputtering method as the insulating film 443. The insulating film 443 can be formed by a sputtering method in a rare gas (typically argon) atmosphere, an oxygen atmosphere, or a mixed atmosphere containing a rare gas and oxygen.

The insulating film 443 is preferably formed appropriately using a method in which entry of impurities such as water and hydrogen can be prevented. To remove residual moisture from the station for depositing the insulating film 443 in a manner similar to that of the formation of the oxide semiconductor film, an entrapment vacuum pump (such as a cryopump) is preferably used. When the insulating film 443 is formed in the deposition station evacuated using a cryopump, the impurity concentration of the insulating film 443 can be reduced. As an evacuation unit for removing moisture remaining in the deposition station for the insulating film 443, a turbo molecular pump provided with a cold trap may be used.

A high-purity gas from which impurities such as hydrogen, water, a hydroxyl group, and hydride are removed is preferably used as a sputtering gas for the deposition of the insulating film 443.

The insulating film 443 can be formed using a material and a method similar to those of the insulating film 413, and an oxide insulating film can be preferably used. The insulating film 443 can be formed by a CVD method using a deposition gas. As the CVD method, an LPCVD method, a plasma CVD method, or the like can be used. Alternatively, a coating method can be used. In this embodiment, a silicon oxynitride film formed by a plasma CVD method is used as the insulating film 443. By a plasma CVD method, particles and the like do not easily enter and attach to a film in deposition, and in addition, a thick film can be deposited with relatively high deposition speed; a plasma CVD method is advantageous in productivity.

Figure 2D:
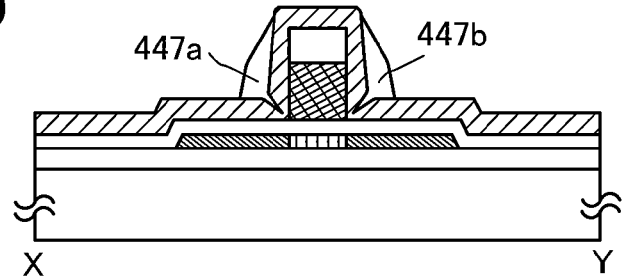
Figure 2E:
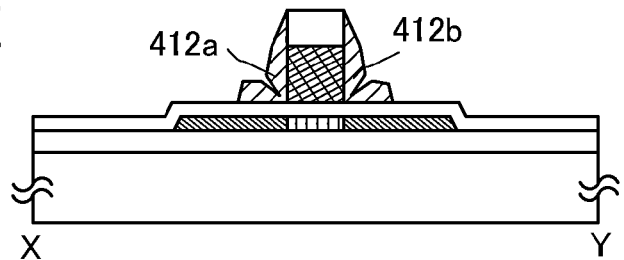

The insulating film 444 is etched, whereby insulating layers 447a and 447b are formed (see FIG. 2D). Further, the insulating film 443 is etched using the gate electrode layer 401 and the insulating layers 447a and 447b as masks, whereby the first sidewall insulating layers 412a and 412b are formed (see FIG. 2E).

In the step of etching the insulating film 443, the insulating layers 447a and 447b used as masks nearly disappear because it takes a long time to etch the insulating film 443 formed of an aluminum oxide film.

An insulating film 448 is formed over the gate electrode layer 401 and the first sidewall insulating layers 412a and 412b. Then, the insulating film 448 is etched, whereby the second sidewall insulating layers 414a and 414b are formed (see FIG. 3A).

Figure 3A:
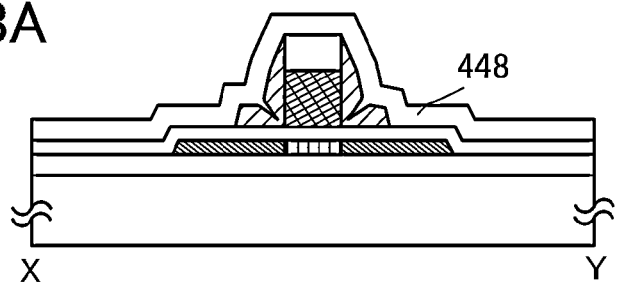
FIGS. 3A to 3E are cross-sectional views illustrating an embodiment of a method for manufacturing a semiconductor device.
Figure 3B:
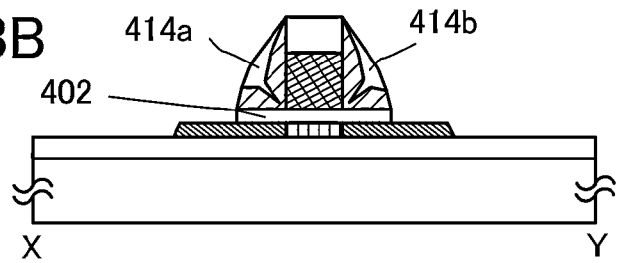

Further, the gate insulating film 442 is etched using the gate electrode layer 401 and the second sidewall insulating layers 414a and 414b as masks, whereby the gate insulating film 402 is formed (see FIG. 3B).

The second sidewall insulating layers 414a and 414b (the insulating film 448) can be formed using a material and a method similar to those of the insulating film 443, and an oxide insulating film can be preferably used. The insulating film 448 can be formed by a CVD method using a deposition gas. As the CVD method, an LPCVD method, a plasma CVD method, or the like can be used. Alternatively, a coating method can be used. In this embodiment, a silicon oxynitride film formed by a plasma CVD method is used as the second sidewall insulating layers 414a and 414b (the insulating film 448). By a plasma CVD method, particles and the like do not easily enter and attach to a film in deposition, and in addition, a thick film can be deposited with relatively high deposition speed; a plasma CVD method is advantageous in productivity.

Accordingly, the second sidewall insulating layers 414a and 414b (the insulating film 448) can cover crevices on the side surfaces of the first sidewall insulating layers 412a and 412b and even the side surfaces. Note that the crevices on the side surfaces of the first sidewall insulating layers 412a and 412b may be filled with the second sidewall insulating layers 414a and 414b, or may remain as a space (cavity) only to cover an opening portion of the crevice.

Next, a conductive film for forming a source electrode layer and a drain electrode layer (including a wiring formed of the same layer as the source electrode layer and the drain electrode layer) is formed over the oxide semiconductor film 403, the gate insulating film 402, the gate electrode layer 401, the first sidewall insulating layers 412a and 412b, the second sidewall insulating layers 414a and 414b, and the insulating film 413.

The conductive film is formed using a material which can withstand heat treatment in a later step. As the conductive film used for the source electrode layer and the drain electrode layer, for example, a metal film containing an element selected from Al, Cr, Cu, Ta, Ti, Mo, and W and a metal nitride film containing any of the above elements as its main component (a titanium nitride film, a molybdenum nitride film, and a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide ($ZnO$), indium oxide-tin oxide ($In_2O_3$—$SnO_2$), indium oxide-zinc oxide ($In_2O_3$—$ZnO$), or any of these metal oxide materials in which silicon oxide is contained can be used.

A resist mask is formed over the conductive film by a photolithography process, and the conductive film is selectively etched, so that an island-shaped conductive film 445 is formed. Then, the resist mask is removed. Note that in this etching step, the conductive film 445 over the gate electrode layer 401 is not removed.

When a 30-nm-thick tungsten film is used as the conductive film, the tungsten film may be etched by a dry etching method to have an island shape (the etching conditions: an etching gas ($CF_4$:$Cl_2$:$O_2$=55 sccm:45 sccm:55 sccm), a power of 3000 W, a bias power of 140 W, and a pressure of 0.67 Pa).

Figure 3C:
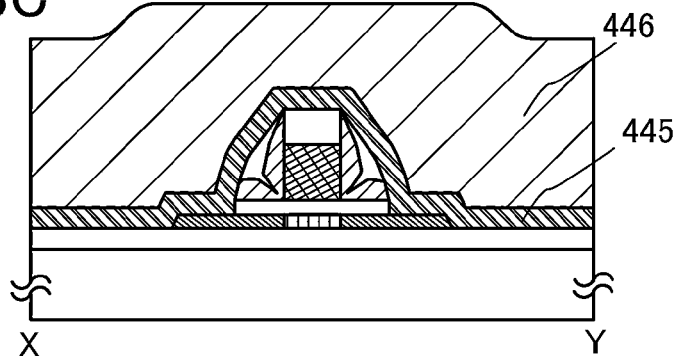

An insulating film 446 to be an interlayer insulating film is stacked over the island-shaped conductive film 445 (see FIG. 3C).

The insulating film 446 can be formed using a material and a method similar to those of the insulating film 413. The insulating film 446 is formed to have a thickness enough to level out unevenness produced by the transistor 440a. In this embodiment, a 300-nm-thick silicon oxynitride film is formed by a CVD method.

Next, polishing treatment is performed on the insulating film 446 and the conductive film 445 by a chemical mechanical polishing method. Part of the insulating film 446 and part of the conductive film 445 are removed so that the insulating film 413 is exposed.

By the polishing treatment, the insulating film 446 is processed into the interlayer insulating film 415, and the conductive film 445 over the gate electrode layer 401 is removed, so that the source electrode layer 405a and the drain electrode layer 405b are formed.

A chemical mechanical polishing method is used for removing the insulating film 446 and the conductive film 445 in this embodiment; however, another cutting (grinding or polishing) method may be used. Further, in addition to the cutting (grinding or polishing) method such as a chemical mechanical polishing method, etching (dry etching or wet etching), plasma treatment, or the like may be employed in combination for the step of removing the conductive film 445 over the gate electrode layer 401. For example, after the removing step by a chemical mechanical polishing method, a dry etching method or plasma treatment (e.g., reverse sputtering method) may be performed in order to improve the planarity of a surface to be processed. When the cutting (grinding or polishing) method is employed in combination with an etching method, plasma treatment, or the like, the order of steps is not particularly limited and may be set as appropriate depending on the materials, the film thicknesses, and the surface roughness of the insulating film 446 and the conductive film 445.

Note that in this embodiment, the source electrode layer 405a and the drain electrode layer 405b are provided in contact with side surfaces of the second sidewall insulating layers 414a and 414b provided on side surfaces of the gate electrode layer 401, and the source electrode layer 405a and the drain electrode layer 405b each of which has an upper end portion positioned a little lower than those of the second sidewall insulating layers 414a and 414b cover the side surfaces of the second sidewall insulating layers 414a and 414b. The shapes of the source electrode layer 405a and the drain electrode layer 405b depend on the conditions of the polishing treatment for removing the conductive film 445, and in some cases, as shown in this embodiment, the source electrode layer 405a and the drain electrode layer 405b are depressed in the film thickness direction from the surfaces of the second sidewall insulating layers 414a and 414b and the insulating film 413 on which polishing treatment is performed. However, depending on the conditions of the polishing treatment, the top ends of the source electrode layer 405a and the drain electrode layer 405b are almost aligned with the top ends of the first sidewall insulating layers 412a and 412b and the top ends of the second sidewall insulating layers 414a and 414b in some cases.

Figure 3D:
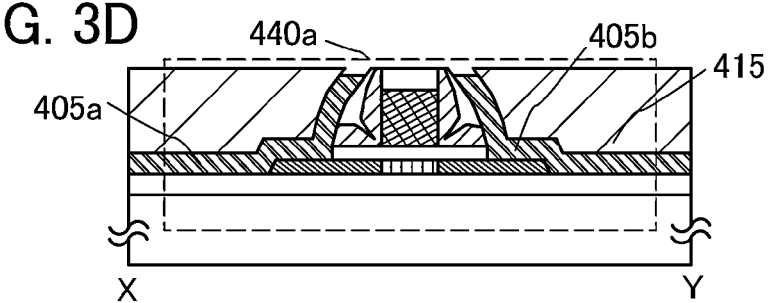

Through the above steps, the transistor 440a of this embodiment is manufactured (see FIG. 3D).

In the manufacturing process of the transistor 440a, the conductive film 445 provided over the gate electrode layer 401, the insulating film 413, the first sidewall insulating layers 412a and 412b, and the second sidewall insulating layers 414a and 414b is removed by chemical mechanical polishing treatment, so that the conductive film 445 is divided; thus, the source electrode layer 405a and the drain electrode layer 405b are formed.

Further, the source electrode layer 405a and the drain electrode layer 405b are provided in contact with the exposed portion of a top surface of the oxide semiconductor film 403, and the second sidewall insulating layers 414a and 414b. The distance between the gate electrode layer 401 and a region (contact region) in which the oxide semiconductor film 403 is in contact with the source electrode layer 405a or the drain electrode layer 405b corresponds to the width of the first sidewall insulating layer 412a or 412b and the second sidewall insulating layers 414a and 414b in the channel length direction, whereby the further miniaturization can be achieved and variation in the manufacturing process can be suppressed.

Accordingly, the distance between the gate electrode layer 401 and the region (contact region) in which the oxide semiconductor film 403 is in contact with the source electrode layer 405a or the drain electrode layer 405b can be made short, so that the resistance between the gate electrode layer 401 and the region (contact region) in which the oxide semiconductor film 403 is in contact with the source electrode layer 405a or the drain electrode layer 405b is reduced; thus, the on-state characteristics of the transistor 440a can be improved.

Further, precise processing can be performed accurately because an etching step using a resist mask is not performed in a step for removing the conductive film 445 over the gate electrode layer 401, which is one step of the formation process of the source electrode layer 405a and the drain electrode layer 405b. Consequently, in a process for manufacturing the semiconductor device, the miniaturized transistor 440a with less variation in shape or characteristics can be manufactured with high yield.

Figure 4A:
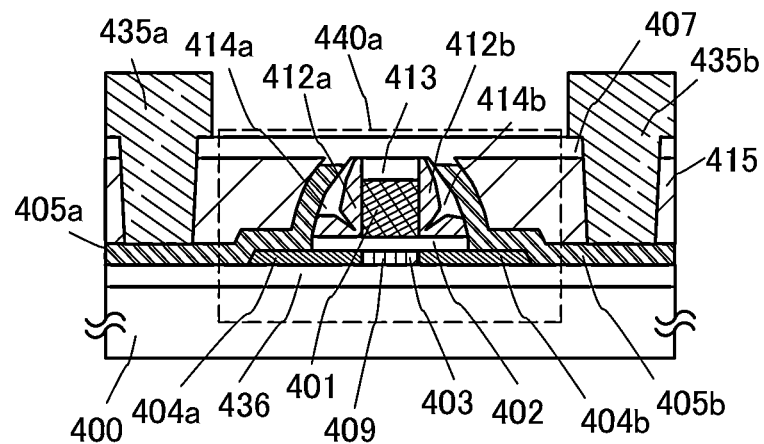
FIGS. 4A to 4C are cross-sectional views each illustrating an embodiment of a semiconductor device.

In the step for removing the conductive film 445 over the gate electrode layer 401, which is one step of the formation process of the source electrode layer 405a and the drain electrode layer 405b, part or all of the insulating film 413 may be removed. FIG. 4C illustrates an example of a transistor 440c in which all of the insulating film 413 is removed and the gate electrode layer 401 is exposed. Further, an upper part of the gate electrode layer 401 may also be removed. A structure in which the gate electrode layer 401 is removed like the transistor 440c can be used for an integrated circuit in which another wiring or another semiconductor element is stacked over the transistor 440c. Note that the transistor 440c is an example in which the top ends of the source electrode layer 405a and the drain electrode layer 405b are almost aligned with the top ends of the first sidewall insulating layers 412a and 412b and the top ends of the second sidewall insulating layers 414a and 414b.

A highly dense inorganic insulating film (typically an aluminum oxide film) which is to be a protective insulating film may be provided over the transistor 440a.

Figure 3E:
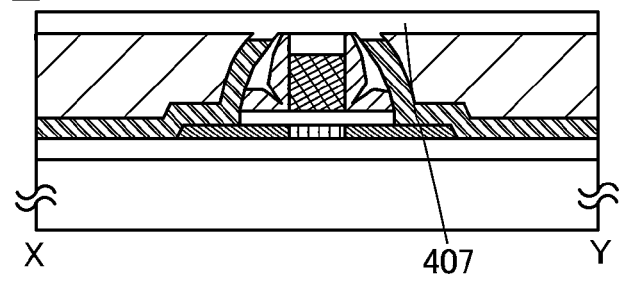

In this embodiment, the insulating film 407 is formed over and in contact with the insulating film 413, the source electrode layer 405a, the drain electrode layer 405b, the first sidewall insulating layers 412a and 412b, the second sidewall insulating layers 414a and 414b, and the interlayer insulating film 415 (see FIG. 3E).

Further, a highly-dense inorganic insulating film (typically an aluminum oxide film) which is to be a protective insulating film may be provided between the interlayer insulating film 415 and the source and drain electrode layers 405a and 405b.

Figure 4B:
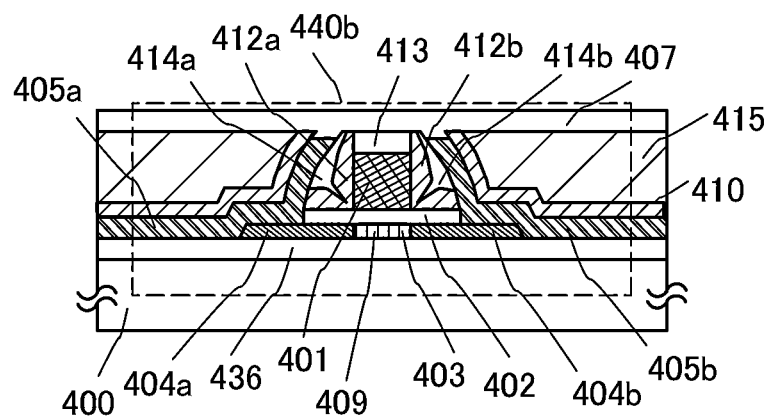
Figure 4C:
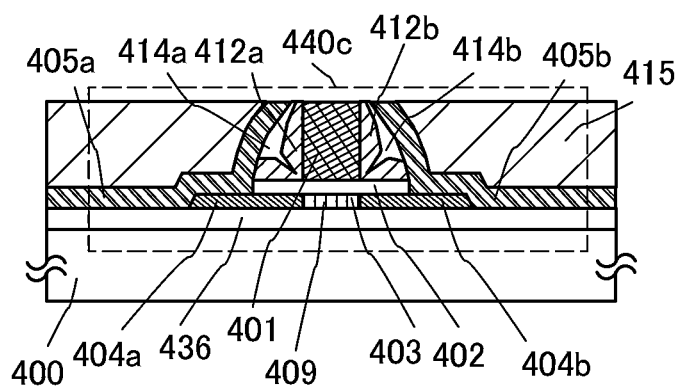

FIG. 4B illustrates an example of the transistor 440b in which an insulating film 410 is provided between the source and drain electrode layers 405a and 405b and the interlayer insulating film 415. In the transistor 440b, a top surface of the insulating film 410 is also planarized by the cutting (grinding or polishing) step which is used in the formation process of the source electrode layer 405a and the drain electrode layer 405b.

The insulating films 407 and 410 may have either a single-layer structure or a stacked-layer structure, and preferably contain at least an aluminum oxide film.

The insulating films 407 and 410 can be formed by a plasma CVD method, a sputtering method, an evaporation method, or the like.

As the insulating films 407 and 410, an inorganic insulating film such as a silicon oxide film, a silicon oxynitride film, an aluminum oxynitride film, or a gallium oxide film can be typically used as well as the aluminum oxide film. Further, a hafnium oxide film, a magnesium oxide film, a zirconium oxide film, a lanthanum oxide film, a barium oxide film, or a metal nitride film (e.g., an aluminum nitride film) can be used.

In this embodiment, an aluminum oxide film is formed by a sputtering method as the insulating films 407 and 410.

Further, a planarization insulating film may be formed thereover in order to reduce surface roughness due to the transistor. As the planarization insulating film, an organic material such as a polyimide-, acrylic-, or benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Further, FIG. 4A illustrates an example in which openings reaching the source electrode layer 405a and the drain electrode layer 405b are formed in the interlayer insulating film 415 and the insulating film 407, and wiring layers 435a and 435b are formed in the openings. With the use of the wiring layers 435a and 435b, the transistor 440a is connected to another transistor or another element, which can lead to formation of a variety of circuits.

The wiring layers 435a and 435b can be formed using a material and a method similar to those of the gate electrode layer 401, the source electrode layer 405a, or the drain electrode layer 405b. For example, a metal film containing an element selected from Al, Cr, Cu, Ta, Ti, Mo, and W, a metal nitride film containing any of the above elements as a component (e.g., a titanium nitride film, a molybdenum nitride film, or a tungsten nitride film), or the like can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. The wiring layers 435a and 435b may be formed using conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For example, as the wiring layers 435a and 435b, a single layer of molybdenum film, a stack of a tantalum nitride film and a copper film, or a stack of a tantalum nitride film and a tungsten film can be used.

As described above, in a semiconductor device, the miniaturized transistors 440a, 440b, and 440c with less variation in shapes or characteristics and high on-state characteristics can be provided with a high yield.

The transistors 440a, 440b, and 440c have stable electrical characteristics.

Accordingly, a semiconductor device which is miniaturized and has stable and good electrical characteristics and a method for manufacturing the semiconductor device can be provided.

Embodiment 2

In this embodiment, an example of a semiconductor device which includes the transistor described in this specification, which can hold stored data even when not powered, and which does not have a limitation on the number of write cycles, will be described with reference to drawings.

Figure 5A:
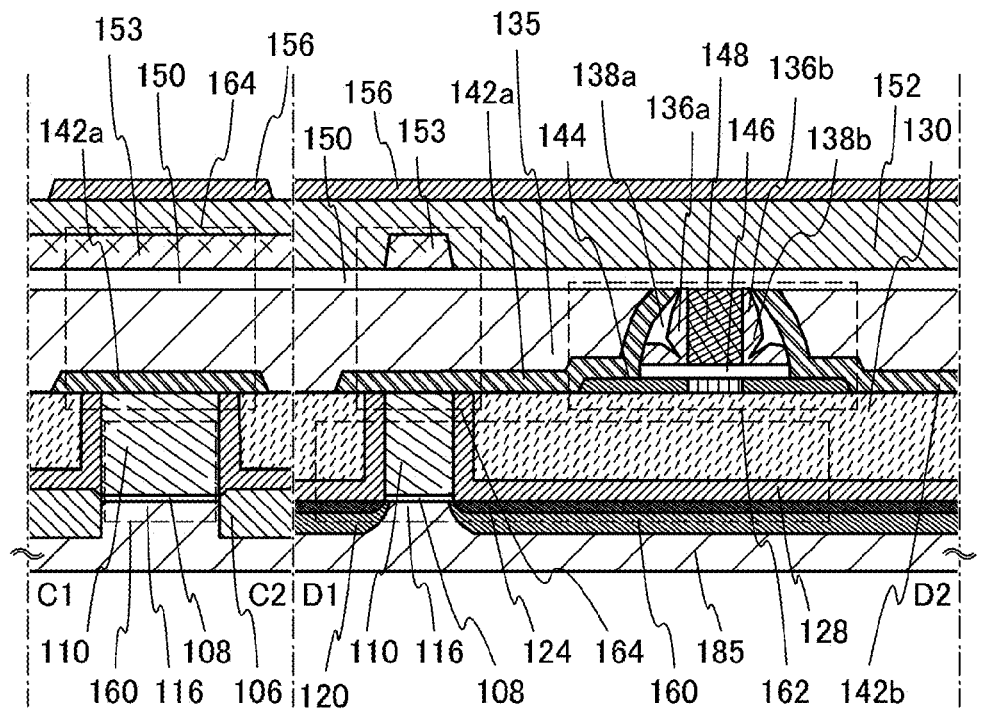
FIGS. 5A to 5C are a cross-sectional view, a plan view, and a circuit diagram showing an embodiment of a semiconductor device.
Figure 5B:
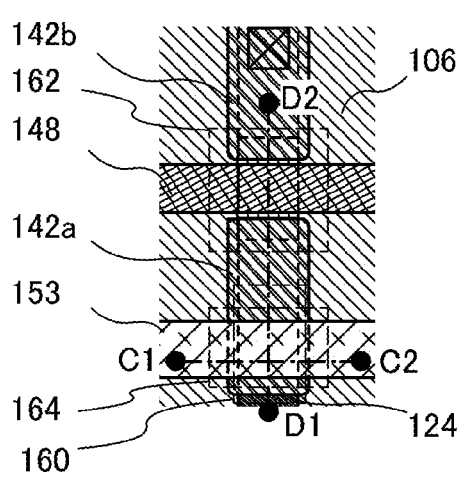
Figure 5C:
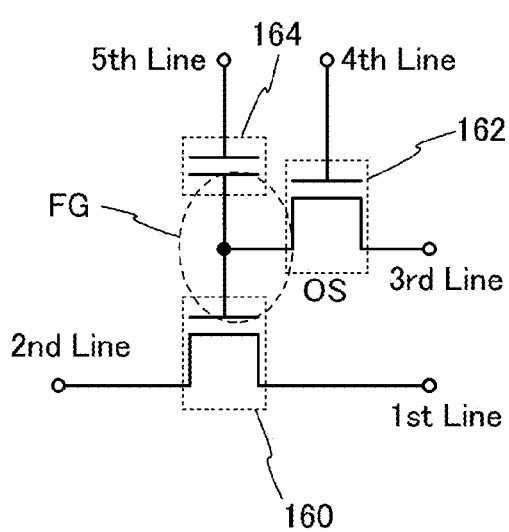

FIGS. 5A to 5C illustrate an example of a structure of a semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line C1-C2 and line D1-D2 in FIG. 5B.

The semiconductor device illustrated in FIGS. 5A to 5C includes a transistor 160 including a first semiconductor material in a lower portion, and a transistor 162 including a second semiconductor material in an upper portion. The transistor 162 is an example to which a structure of the transistor 440a described in Embodiment 1 is applied.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor can hold charge for a long time owing to its characteristics.

Although all the transistors are n-channel transistors here, it is needless to say that p-channel transistors can be used. The specific constituent of the semiconductor device is not necessarily limited to those described here such as the material used for the semiconductor device and the structure of the semiconductor device (e.g., the use of the transistor described in Embodiment 1, which is formed using an oxide semiconductor, as the transistor 162 for holding information).

The transistor 160 in FIG. 5A includes a channel formation region 116 provided in a substrate 185 containing a semiconductor material (e.g., silicon), impurity regions 120 provided so that the channel formation region 116 is sandwiched therebetween, metal compound regions 124 in contact with the impurity regions 120, a gate insulating film 108 provided over the channel formation region 116, and a gate electrode 110 provided over the gate insulating film 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

An element isolation insulating layer 106 is provided over the substrate 185 to surround the transistor 160. An insulating layer 128 and an insulating layer 130 are provided to cover the transistor 160. Note that, in the transistor 160, sidewall insulating layers may be formed on side surfaces of the gate electrode 110, and a region having a different impurity concentration may be formed in the impurity regions 120 using the sidewall insulating layers.

The transistor 160 formed using a single crystal semiconductor substrate can operate at high speed. Thus, when the transistor is used as a reading transistor, data can be read at a high speed. The two insulating films are formed so as to cover the transistor 160. As treatment prior to the formation of the transistor 162 and a capacitor 164, CMP treatment is performed on the two insulating films, whereby the planarized insulating layer 128 and the insulating layer 130 are formed and an upper surface of the gate electrode 110 is exposed.

As the insulating layer 128 and the insulating layer 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 128 and the insulating layer 130 can be formed by a plasma CVD method, a sputtering method, or the like.

Alternatively, an organic material such as a polyimide-, acrylic-, or benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128, and a silicon oxide layer is used as the insulating layer 130.

Planarization treatment is preferably performed on the surface of the insulating layer 130 in the formation region of the oxide semiconductor film 144. In this embodiment, the oxide semiconductor film 144 is formed over the insulating layer 130 sufficiently planarized by polishing treatment such as CMP treatment (the average surface roughness of the surface of the insulating layer 130 is preferably less than or equal to 0.15 nm).

The transistor 162 shown in FIG. 5A includes an oxide semiconductor in the channel formation region. Here, the oxide semiconductor film 144 included in the transistor 162 is preferably highly purified. By using a highly purified oxide semiconductor, the transistor 162 which has extremely favorable off-state current characteristics can be obtained.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

In the manufacturing process of the transistor 162, electrode layers 142a and 142b which function as a source electrode layer and a drain electrode layer are formed in the step of removing a conductive film provided over a gate electrode 148, first sidewall insulating layers 136a and 136b, and second sidewall insulating layers 138a and 138b by chemical mechanical polishing treatment. The second sidewall insulating layers 138a and 138b are provided so as to cover crevices on side surfaces of the first sidewall insulating layers 136a and 136b and even the side surfaces. The electrode layers 142a and 142b are in contact with side surfaces of the second sidewall insulating layers 138a and 138b and the oxide semiconductor film 144.

The second insulating layers 138a and 138b can prevent electrical defects such as a short circuit and a leakage current between the gate electrode 148 and the electrode layers 142a and 142b. In addition, oxygen can be supplied into the oxide semiconductor film 144 by the first sidewall insulating layers 136a and 136b formed of an aluminum oxide film and oxygen release and entry of impurities such as hydrogen can be suppressed.

Accordingly, in the transistor 162, the distance between the gate electrode 148 and a region (contact region) in which the oxide semiconductor film 144 is in contact with the electrode layer 142a or the electrode layer 142b which functions as a source or drain electrode layer can be made short, so that the resistance between the gate electrode 148 and the region (contact region) in which the oxide semiconductor film 144 is in contact with the electrode layer 142a or the electrode layer 142b is reduced; thus, the on-state characteristics of the transistor 162 can be improved.

Further, precise processing can be performed accurately because an etching step using a resist mask is not performed in the step of removing the conductive film over the gate electrode 148, which is one step of the formation process of the electrode layers 142a and 142b. Consequently, in a process for manufacturing the semiconductor device, a miniaturized transistor with less variation in shape or characteristics can be manufactured with high yield.

An interlayer insulating film 135 and an insulating film 150 each of which has a single-layer structure or a stacked-layer structure are provided over the transistor 162. In this embodiment, an aluminum oxide film is used as the insulating film 150. The density of the aluminum oxide film is made to be high (the film density is higher than or equal to 3.2 g/cm$^3$, preferably higher than or equal to 3.6 g/cm$^3$), whereby stable electrical characteristics can be given to the transistor 162.

In addition, a conductive layer 153 is provided in a region overlapping with the electrode layer 142a of the transistor 162 with the interlayer insulating film 135 and the insulating film 150 interposed therebetween. The electrode layer 142a, the interlayer insulating film 135, the insulating film 150, and the conductive layer 153 form a capacitor 164. That is, the source electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

An insulating film 152 is provided over the transistor 162 and the capacitor 164. In addition, a wiring 156 for connecting the transistor 162 to another transistor is provided over the insulating film 152. Although not illustrated in FIG. 5A, the wiring 156 is electrically connected to the electrode layer 142b through an electrode formed in an opening provided in the insulating film 150, the insulating film 152, a gate insulating film 146, and the like. Here, the electrode is preferably provided so as to partly overlap with at least the oxide semiconductor film 144 of the transistor 162.

In FIGS. 5A and 5B, the transistor 160 is provided to overlap with at least part of the transistor 162. The source region or the drain region of the transistor 160 is preferably provided to overlap with part of the oxide semiconductor film 144. Further, the transistor 162 and the capacitor 164 are provided so as to overlap with at least part of the transistor 160. For example, the conductive layer 153 of the capacitor 164 is provided so as to overlap with at least part of the gate electrode 110 of the transistor 160. With such a planar layout, the area occupied by the semiconductor device can be reduced; thus, higher integration can be achieved.

Note that the electrical connection between the electrode layer 142b and the wiring 156 may be established by contacting the electrode layer 142b with the wiring 156 directly or may be established through an electrode provided in an insulating layer which is between the electrode layer 142b and the wiring 156. Alternatively, the electrical connection may be established through a plurality of electrodes.

Next, an example of a circuit configuration corresponding to FIGS. 5A and 5B is illustrated in FIG. 5C.

In FIG. 5C, a first wiring (1st line) is electrically connected to a source electrode of the transistor 160. A second wiring (2nd line) is electrically connected to a drain electrode of the transistor 160. A third wiring (3rd line) and one of source or drain electrodes of the transistor 162 are electrically connected to each other. A fourth wiring (4th line) and a gate electrode of the transistor 162 are electrically connected to each other. A gate electrode of the transistor 160 and one of the source electrode and the drain electrode of the transistor 162 are electrically connected to one electrode of the capacitor 164. A fifth wiring (5th line) and the other electrode of the capacitor 164 are electrically connected to each other.

The semiconductor device in FIG. 5C utilizes a characteristic in which the potential of the gate electrode of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is given to the gate electrode of the transistor 160 (writing). Here, charge for supply of a potential level or charge for supply of a different potential level (hereinafter referred to as low-level charge and high-level charge) is given. After that, the potential of the fourth wiring is set to a potential at which the transistor 162 is turned off, so that the transistor 162 is turned off. Thus, the charge given to the gate electrode of the transistor 160 is held (holding).

Since the off-state current of the transistor 162 is extremely low, the charge of the gate electrode of the transistor 160 is held for a long time.

Next, reading data will be described. By supplying an appropriate potential (reading potential) to the fifth wiring while a predetermined potential (constant potential) is supplied to the first wiring, the potential of the second wiring varies depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an OFF state. Therefore, the stored data can be read by the potential of the second wiring.

Note that in the case where memory cells are arrayed to be used, only data of desired memory cells needs to be read. In the case where such reading is not performed, a potential at which the transistor 160 is turned off, that is, a potential smaller than $V_{th\_H}$ may be given to the fifth wiring regardless of the state of the gate electrode of the transistor 160. Alternatively, a potential which allows the transistor 160 to be turned on regardless of a state of the gate electrode, that is, a potential higher than $V_{th\_L}$, may be applied to the fifth wiring.

Figure 12A:
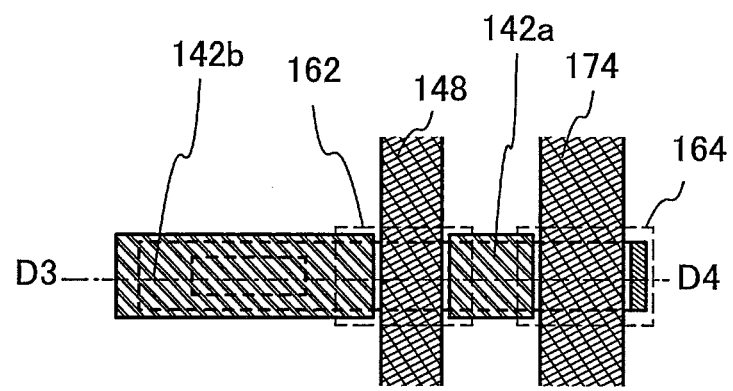
FIGS. 12A and 12B are a plan view and a cross-sectional view illustrating an embodiment of a semiconductor device.
Figure 12B:
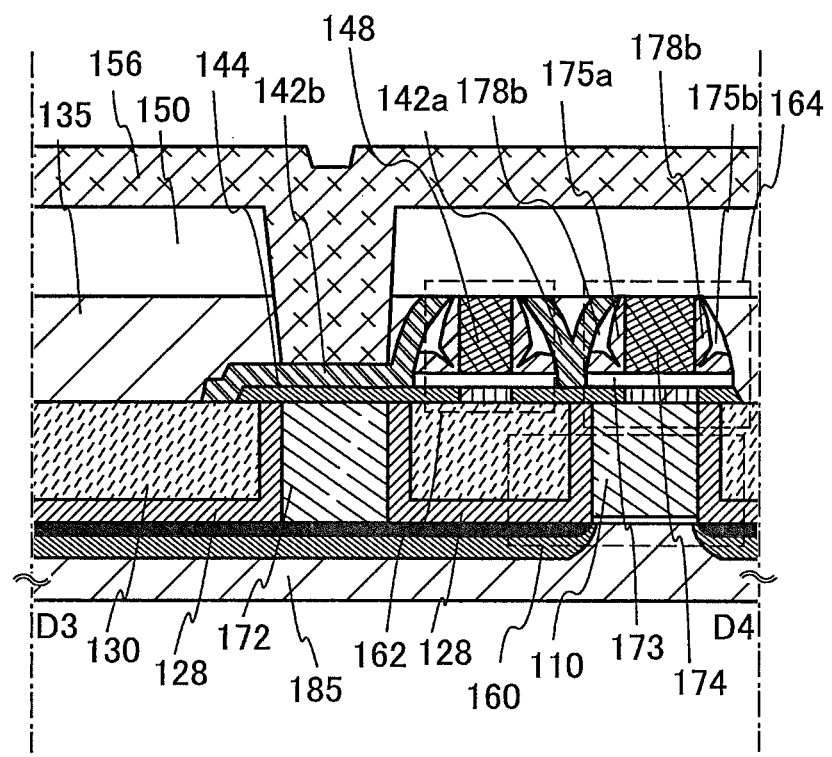

FIGS. 12A and 12B illustrate another example of the semiconductor device. FIG. 12A and FIG. 12B are a plan view and a cross-sectional view of the semiconductor device, respectively. Here, FIG. 12B corresponds to the cross section along line D3-D4 in FIG. 12A. Note that in FIG. 12A, some components of the semiconductor device illustrated in FIG. 12B are omitted for clarity.

In FIGS. 12A and 12B, the capacitor 164 includes the gate electrode 110, the oxide semiconductor film 144, an insulating film 173, and a conductive layer 174. The conductive layer 174 is formed by the same steps as the gate electrode 148, and side surfaces of the conductive layer 174 are covered with first sidewall insulating layers 175a and 175b. The first sidewall insulating layers 175a and 175b are aluminum films whose surfaces have crevices. Second sidewall insulating layers 178a and 178b are provided so as to cover the crevices of the first sidewall insulating layers 175a and 175b.

The second insulating layers 178a and 178b can prevent electrical defects such as a short circuit and a leakage current between the conductive layer 174 and the electrode layers 142a. In addition, oxygen can be supplied into the oxide semiconductor film 144 by the first sidewall insulating layers 175a and 175b formed of an aluminum oxide film and oxygen release and entry of impurities such as hydrogen can be suppressed.

The electrode layer 142b of the transistor 162 is electrically connected to the wiring 156 in an opening which is formed in the interlayer insulating film 135 and the insulating film 150 and reaches the electrode layer 142b. Further, a conductive layer 172 is provided below and in contact with the oxide semiconductor film 144, and electrically connects the transistor 160 to the transistor 162.

As illustrated in FIGS. 12A and 12B, the transistor 160, the transistor 162, and the capacitor 164 are closely stacked to overlap with each other. Accordingly, the area occupied by the semiconductor device can be reduced; thus, higher integration can be achieved.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to an embodiment of the present invention does not have a limit on the number of times of writing which is a problem in a conventional nonvolatile memory, and reliability thereof is drastically improved. Furthermore, data is written by switching the transistor on and off, whereby high-speed operation can be easily realized.

As described above, a miniaturized and highly-integrated semiconductor device having stable and high electrical characteristics and a method for manufacturing the semiconductor device can be provided.

The methods and structures described in this embodiment can be combined as appropriate with any of the methods and structures described in the other embodiments.

Embodiment 3

In this embodiment, a semiconductor device which includes the transistor described in Embodiment 1 or 2, which can hold stored data even when not powered, and which does not have a limitation on the number of write cycles, and which has a structure different from the structure described in Embodiment 2 is described with reference to FIGS. 6A and 6B and FIGS. 7A and 7B.

Figure 6A:
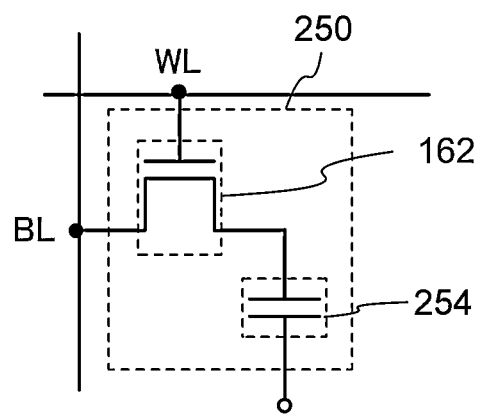
FIGS. 6A and 6B are a circuit diagram and a perspective view showing an embodiment of a semiconductor device.
Figure 6B:
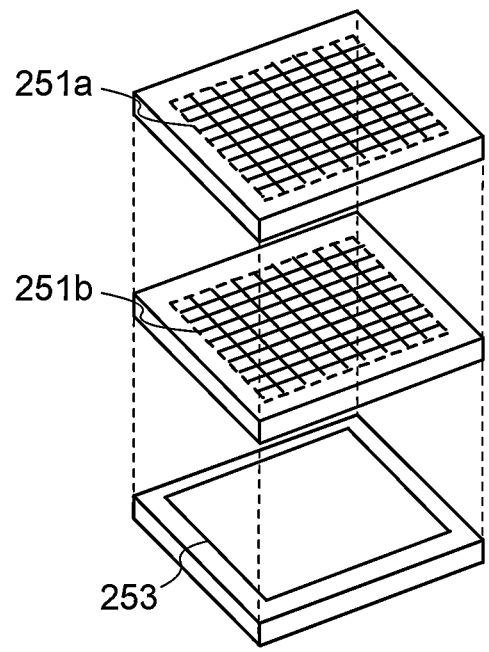

FIG. 6A illustrates an example of a circuit configuration of a semiconductor device. FIG. 6B is a conceptual diagram illustrating an example of a semiconductor device. The semiconductor device illustrated in FIG. 6A will be described, and then, the semiconductor device illustrated in FIG. 6B will be described.

In the semiconductor device illustrated in FIG. 6A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

Next, writing and holding of data in the semiconductor device (a memory cell 250) illustrated in FIG. 6A will be described.

The potential of the word line WL is set to a potential at which the transistor 162 is turned on, and the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the charge at the first terminal of the capacitor 254 is held (holding).

In addition, off-state current is extremely small in the transistor 162 which includes an oxide semiconductor. For that reason, a potential of the first terminal of the capacitor 254 (or a charge accumulated in the capacitor 254) can be held for an extremely long period by turning off the transistor 162.

Secondly, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 6B will be described.

The semiconductor device illustrated in FIG. 6B includes a memory cell array 251 (memory cell arrays 251a and 251b) including a plurality of memory cells 250 illustrated in FIG. 6A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 6B illustrates, as an example, the semiconductor device in which two memory cell arrays (the memory cell array 251a and the memory cell array 251b) are stacked. Note that the number of stacked memory cell arrays is not limited thereto; three or more memory cells may be stacked.

Next, a specific structure of the memory cell 250 illustrated in FIG. 6A will be described with reference to FIGS. 7A and 7B.

Figure 7A:
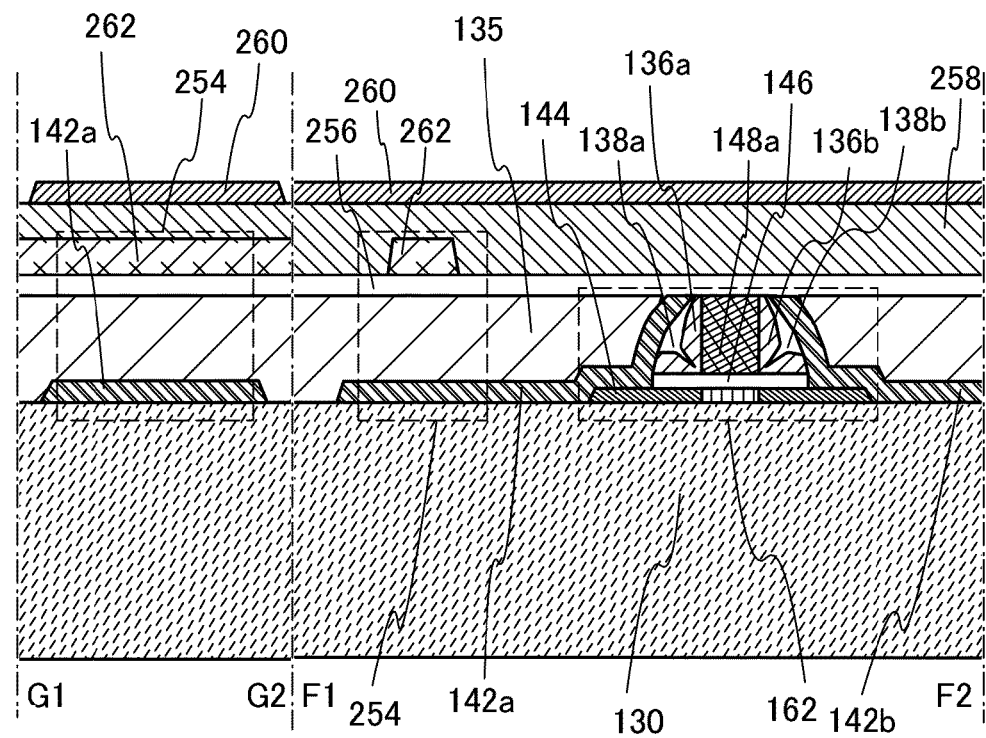
FIGS. 7A and 7B are a cross-sectional view and a plan view showing an embodiment of a semiconductor device.
Figure 7B:
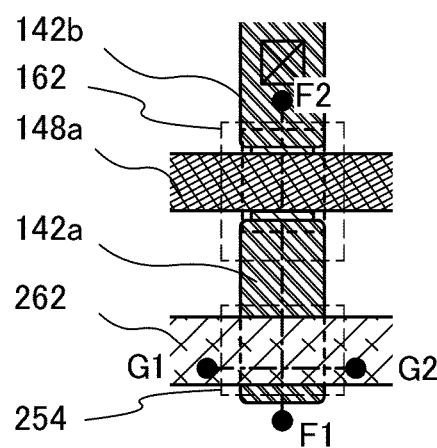

FIGS. 7A and 7B illustrate an example of a structure of the memory cell 250. FIG. 7A is a cross-sectional view of the memory cell 250, and FIG. 7B is a plan view of the memory cell 250. Here, FIG. 7A illustrates a cross section taken along line F1-F2 and line G1-G2 in FIG. 7B.

The transistor 162 in FIGS. 7A and 7B can have the same structure as the transistor in Embodiment 1 or 2.

An insulating film 256 having a single-layer structure or a stacked-layer structure is provided over the transistor 162 over the insulating layer 130. In addition, a conductive layer 262 is provided in a region overlapping with the electrode layer 142a of the transistor 162 with the insulating film 256 interposed therebetween, and the electrode layer 142a, the interlayer insulating film 135, the insulating film 256, and the conductive layer 262 form a capacitor 254. That is, the electrode layer 142a of the transistor 162 functions as one electrode of the capacitor 254, and the conductive layer 262 functions as the other electrode of the capacitor 254.

An insulating film 258 is provided over the transistor 162 and the capacitor 254. Further, the memory cell 250 and a wiring 260 for connecting the adjacent memory cells 250 are provided over the insulating film 258. Although not illustrated, the wiring 260 is electrically connected to the electrode layer 142b of the transistor 162 through an opening provided in the insulating film 256, the insulating film 258, and the like. The wiring 260 may be electrically connected to the electrode layer 142b through another conductive layer provided in the opening. Note that the wiring 260 corresponds to the bit line BL in the circuit diagram of FIG. 6A.

In FIGS. 7A and 7B, the electrode layer 142b of the transistor 162 can also function as a source electrode of a transistor included in an adjacent memory cell. With such a planar layout, the area occupied by the semiconductor device can be reduced; thus, higher integration can be achieved.

When the planar layout in FIG. 7A is employed, the area occupied by the semiconductor device can be reduced; thus, the degree of integration can be increased.

Figure 13A:
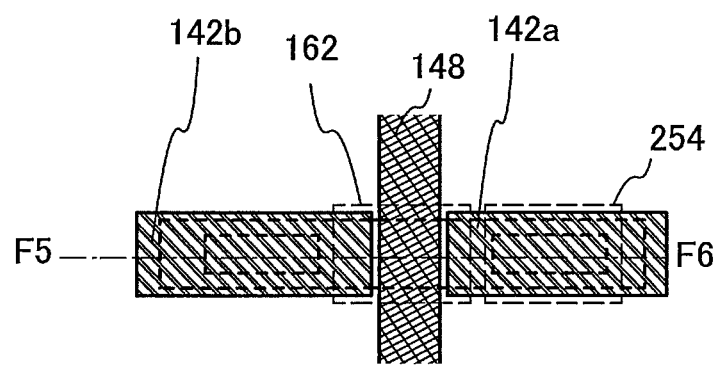
FIGS. 13A and 13B are a plan view and a cross-sectional view illustrating an embodiment of a semiconductor device.
Figure 13B:
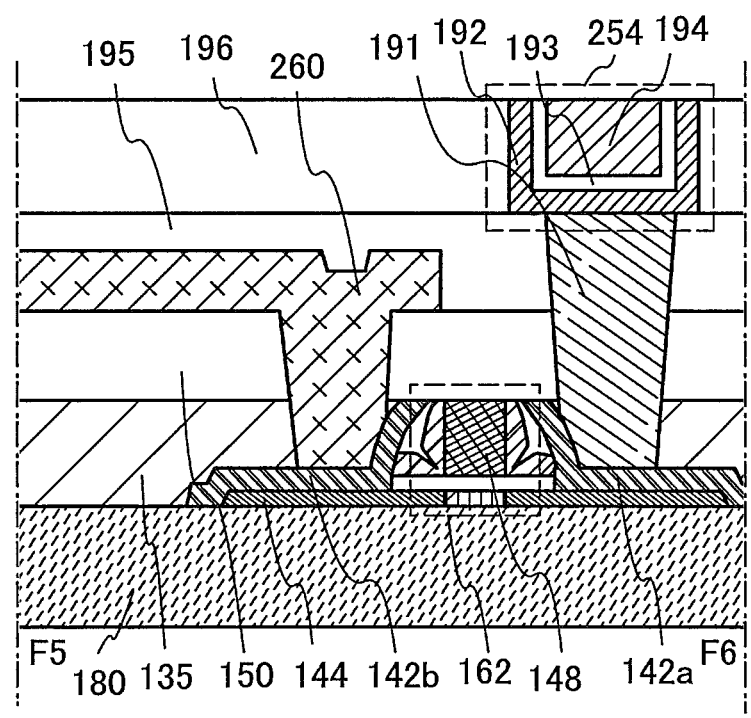

FIGS. 13A and 13B illustrate another example of the semiconductor device.

FIG. 13A and FIG. 13B are a plan view and a cross-sectional view of the semiconductor device, respectively. Here, FIG. 13B corresponds to a cross section taken along line F5-F6 of FIG. 13A. Note that in FIG. 13A, some components of the semiconductor device illustrated in FIG. 13B are omitted for clarity.

In FIGS. 13A and 13B, the capacitor 254 includes a conductive layer 192, an insulating film 193, and a conductive layer 194, and is formed in an insulating film 196. Note that an insulating material having high dielectric constant is preferably used for the insulating film 193. The capacitor 254 and the transistor 162 are electrically connected to each other through a conductive layer 191 provided in the opening which is formed in the interlayer insulating film 135, the insulating film 150, and an insulating film 195 and reaches the electrode layer 142a of the transistor 162.

As illustrated in FIGS. 13A and 13B, the transistor 162 and the capacitor 164 are closely stacked to overlap with each other, whereby the area occupied by the semiconductor device can be decreased; thus, the semiconductor device can be highly integrated.

As described above, the plurality of memory cells formed in multiple layers in the upper portion is each formed with a transistor including an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having stable and high electrical characteristics and a method for manufacturing the semiconductor device can be provided.

This embodiment can be implemented in appropriate combination with the structures described in the other embodiments.

Embodiment 4

In this embodiment, examples of application of the semiconductor device described in any of the above embodiments to portable devices such as cellular phones, smartphones, or electronic books will be described with reference to FIGS. 8A and 8B, FIG. 9, FIG. 10, and FIG. 11.

In portable electronic devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 8A:
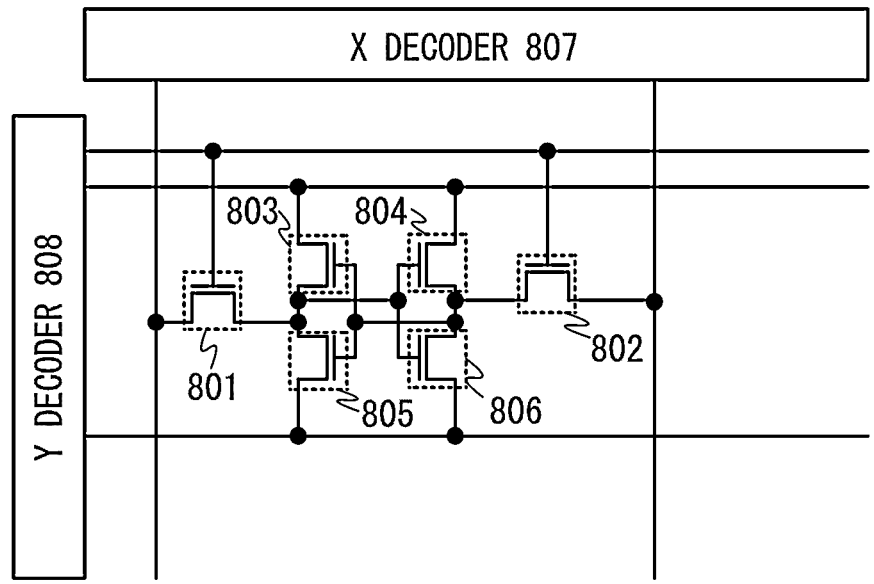
FIGS. 8A and 8B are circuit diagrams showing an embodiment of a semiconductor device.

In an ordinary SRAM, as illustrated in FIG. 8A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 8B:
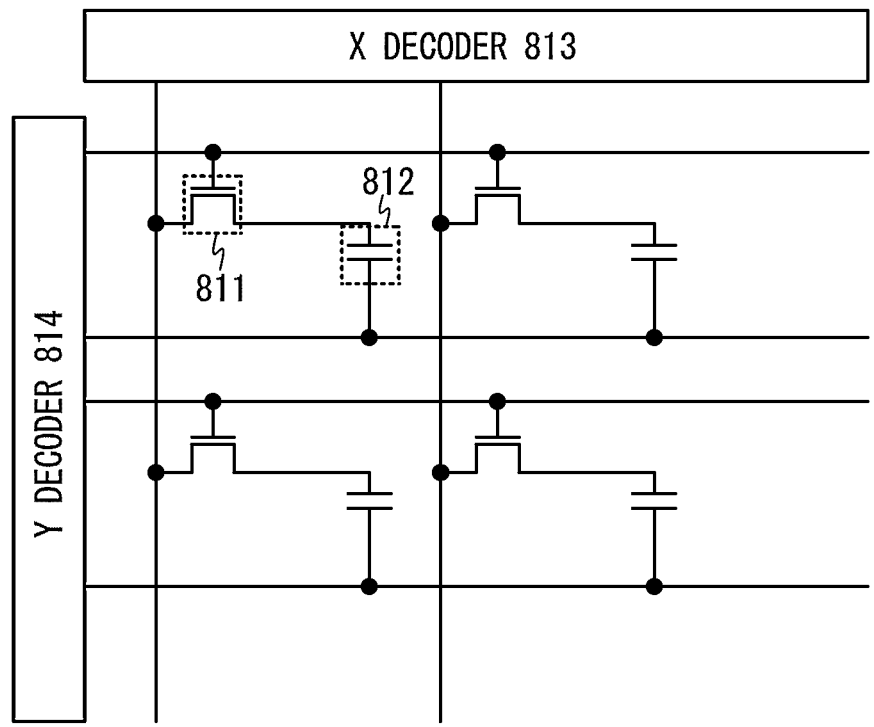

In a DRAM, as illustrated in FIG. 8B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally 10 $F^2$ or less. Note that in the case of a DRAM, a refresh operation is always necessary and power is consumed even when a rewriting operation is not performed.

However, the area of the memory cell of the semiconductor device described the above embodiments is about 10 $F^2$ and frequent refreshing is not needed. Therefore, the area of the memory cell is reduced, and the power consumption can be reduced.

Figure 9:
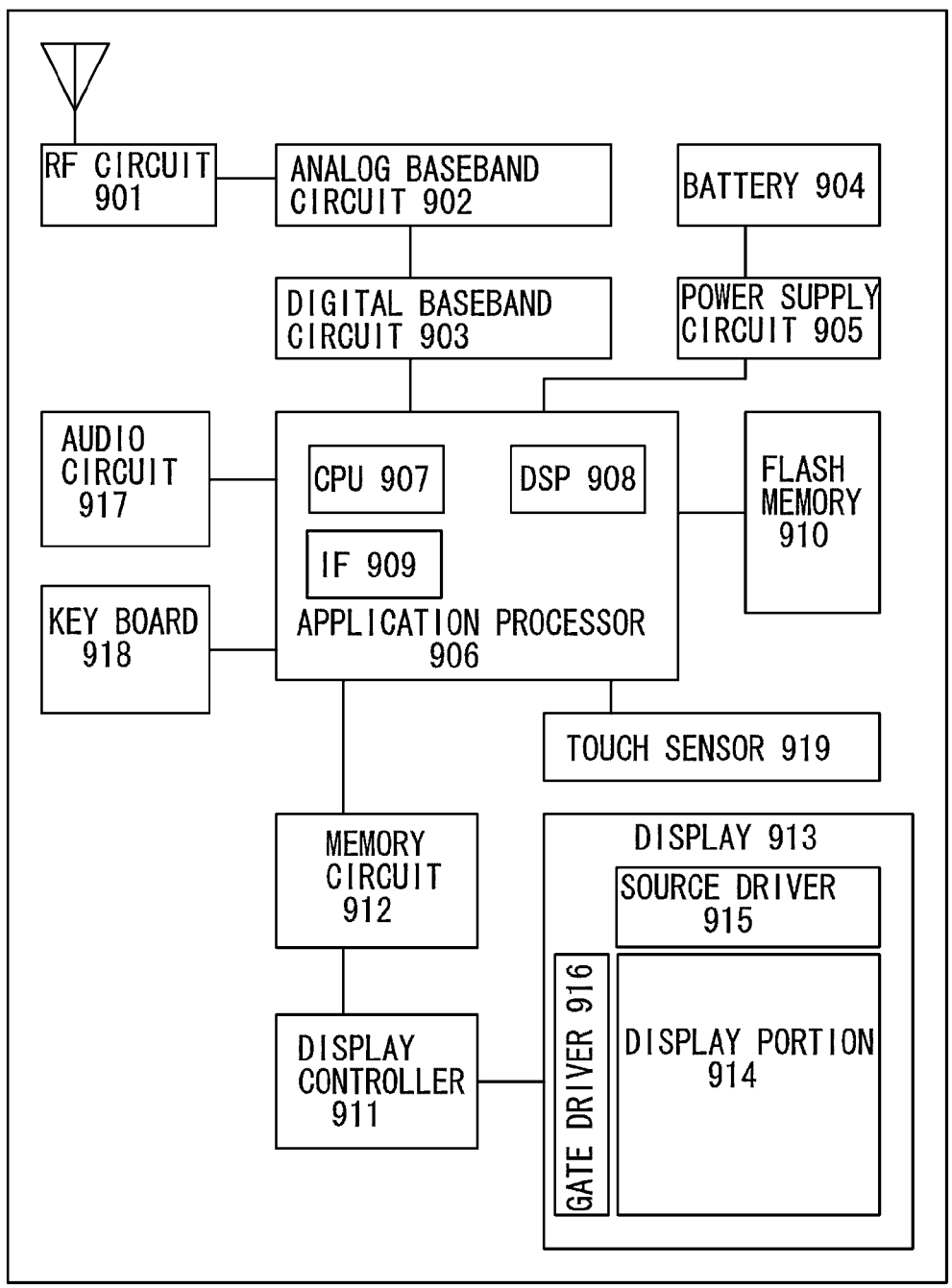
FIG. 9 is a block diagram showing an embodiment of a semiconductor device.

FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 10:
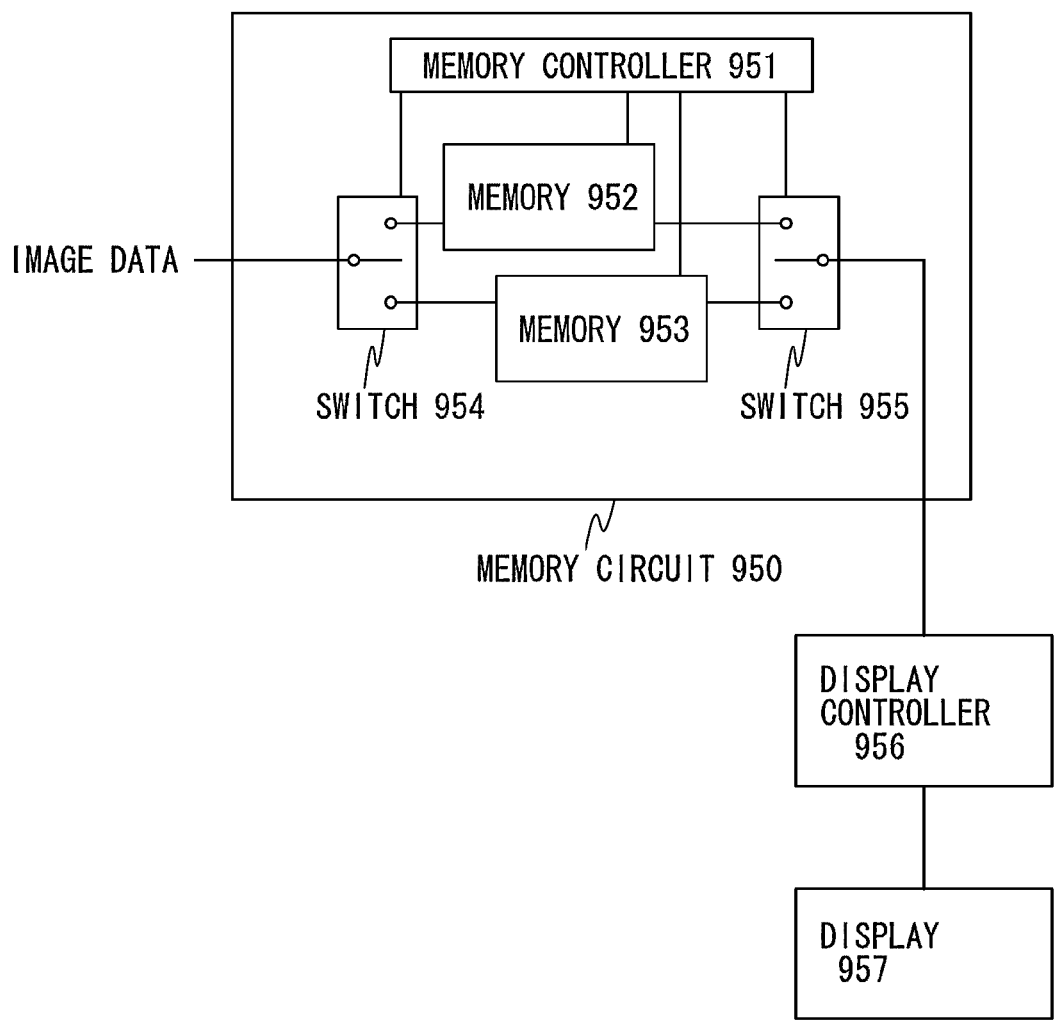
FIG. 10 is a block diagram of an embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is held in the memory 952 though the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 at a frequency of approximately 30 Hz to 60 Hz.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
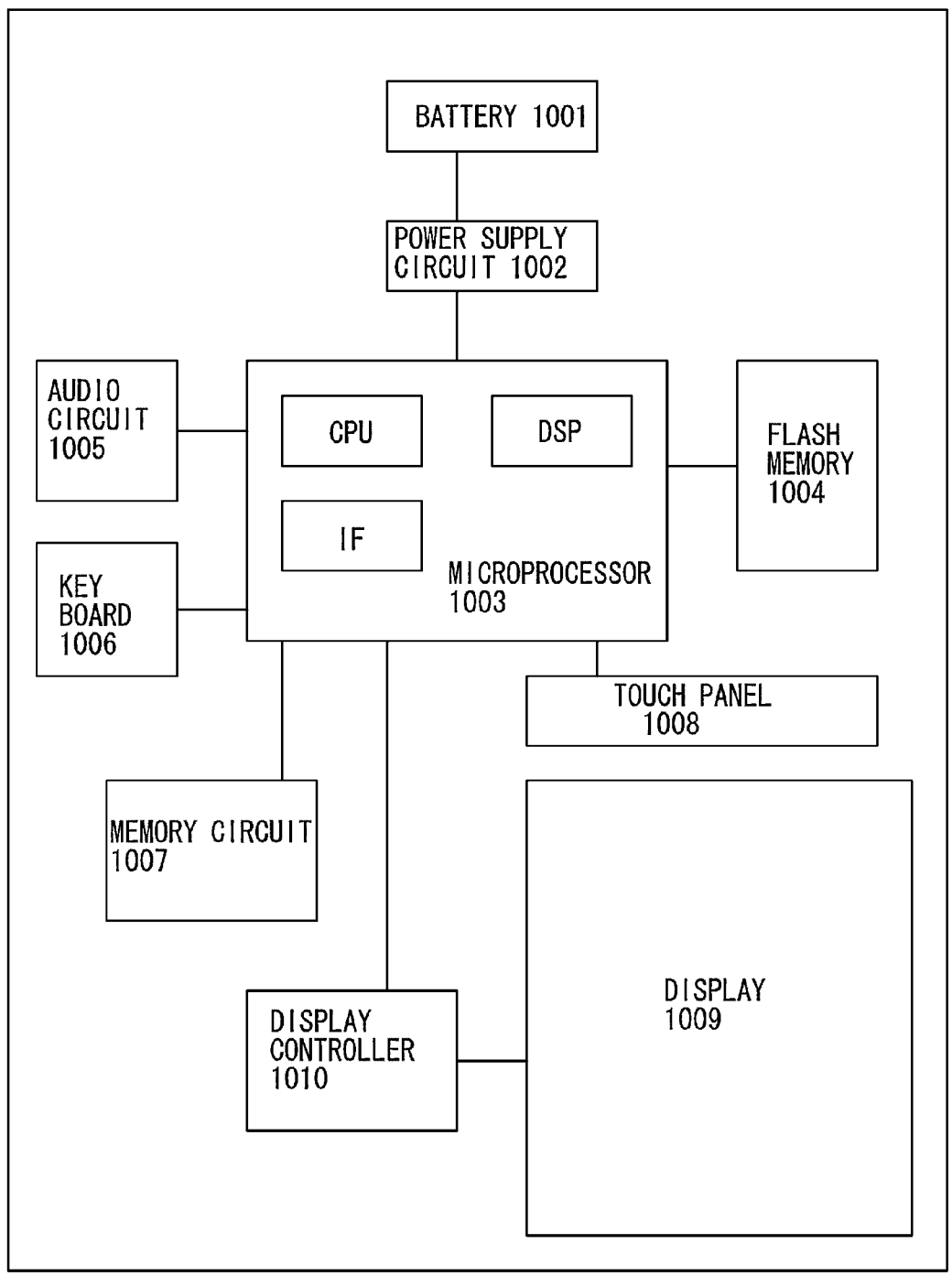
FIG. 11 is a block diagram showing an embodiment of a semiconductor device.

FIG. 11 is a block diagram of an electronic book. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable electronic device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

Example 1

In this example, a transistor was formed and a cross-section of the transistor was observed. Description is made with reference to FIG. 14.

As the transistor, an example transistor which has a structure similar to that of the transistor 440c illustrated in FIG. 4C was formed. However, the steps after the step of forming a source electrode layer and a drain electrode layer was not performed on the example transistor. A method for manufacturing the example transistor is described below.

As an insulating film 11, a 300-nm-thick silicon oxide film was formed over a silicon substrate by a sputtering method (the deposition conditions: an atmosphere of oxygen (oxygen=50 sccm), a pressure of 0.4 Pa, a power supply (power supply output) of 5.0 kW, a distance between the silicon substrate and a target of 60 mm, and a substrate temperature of 100° C.).

As an oxide semiconductor film, a 20-nm-thick IGZO film was formed over the silicon oxide film by a sputtering method with the use of an oxide target containing In, Ga, and Zn in the atomic ratio of 3:1:2. The deposition conditions were as follows: an atmosphere of argon and oxygen (argon:oxygen=30 sccm:15 sccm), a pressure of 0.4 Pa, a power of 0.5 kW, and a substrate temperature of 200° C.

Next, the oxide semiconductor film was etched by a dry etching method to form an island-shaped oxide semiconductor film 12 (the etching conditions: an etching gas ($BCl_3$:$Cl_2$=60 sccm:20 sccm), a power of an ICP power supply of 450 W, a bias power of 100 W, and a pressure of 1.9 Pa).

Next, as a gate insulating film, a 20-nm-thick silicon oxynitride film was formed by a CVD method (the deposition conditions: $SiH_4$:$N_2O$=1 sccm:800 sccm, a pressure of 40 Pa, a power of an RF power supply (power supply output) of 150 W, a power supply frequency of 60 MHz, a distance between the silicon substrate and a target of 28 mm, and a substrate temperature of 400° C.).

A stack of a 30-nm-thick tantalum nitride film and a 200-nm-thick tungsten film were formed over the gate insulating film by a sputtering method. The deposition conditions of the tantalum nitride film were as follows: an atmosphere of argon and nitrogen (argon:nitrogen=50 sccm:10 sccm), a pressure of 0.6 Pa, and a power of 1 kW. The deposition conditions of the tungsten film were as follows: an atmosphere of argon (argon=100 sccm), a pressure of 2.0 Pa, and a power of 4 kW.

The tantalum nitride film and the tungsten film were etched by dry etching methods, so that gate electrode layers 14a and 14b were formed. The first etching conditions were as follows: an etching gas ($CF_4$:$Cl_2$:$O_2$=55 sccm:45 sccm:55 sccm), an ICP power supply of 3 kW, a bias power of 110 W, and a pressure of 0.67 Pa. The second etching conditions were as follows: an etching gas ($Cl_2$=100 sccm), a power of 2 kW, a bias power of 50 W, and a pressure of 0.67 Pa. The third etching conditions were as follows: an etching gas ($Cl_2$=100 sccm), a power of 1 kW, a bias power of 25 W, and a pressure of 2.0 Pa).

Next, as an insulating film, a 70-nm-thick aluminum oxide film was deposited over the gate electrode layers 14a and 14b by sputtering (the deposition conditions: an atmosphere of argon and oxygen (argon:oxygen=25 sccm:25 sccm), a pressure of 0.4 Pa, a power of 2.5 kW, a distance between the glass substrate and the target of 60 mm, and a substrate temperature of 250° C.).

As an insulating film, a 70-nm-thick silicon oxynitride film was formed over the aluminum oxide film by a CVD method (the deposition conditions: $SiH_4$:$N_2O$=1 sccm:800 sccm, a pressure of 40 Pa, a power of an RF power supply (power supply output) of 150 W, a power supply frequency of 60 MHz, a distance between the silicon substrate and the target of 28 mm, and a substrate temperature of 400° C.). Further, the silicon oxynitride film was etched by a dry etching method (the etching conditions: an etching gas ($CHF_3$:He=30 sccm:120 sccm), a power of an ICP power supply of 3 kW, a bias power of 200 W, a pressure of 2.0 Pa, and a lower electrode temperature of −10° C.). Accordingly, an insulating layer covering side surfaces of the gate electrode layers 14a and 14b was formed. The aluminum oxide film and the gate insulating film were etched using the gate electrode layers 14a and 14b and the insulating layer as masks, whereby first sidewall insulating layers 16a and 16b and a gate insulating film 13 were formed. Note that the etching conditions of the aluminum oxide film were as follows: an etching gas ($BCl_3$:=80 sccm), an ICP power supply of 550 W, a bias power of 150 W, a pressure of 1.0 Pa, and a lower electrode temperature of 70° C.

As an insulating film, a 50-nm-thick silicon oxynitride film was formed over the gate electrode layers 14a and 14b and the first sidewall insulating layers 16a and 16b (the deposition conditions: $SiH_4$:$N_2O$=1 sccm:800 sccm, a pressure of 40 Pa, a power of an RF power supply (power supply output) of 150 W, a power supply frequency of 60 MHz, a distance between the silicon substrate and the target of 28 mm, and a substrate temperature of 400° C.). Further, the silicon oxynitride film was etched by a dry etching method (the etching conditions: an etching gas ($CHF_3$:He=30 sccm:120 sccm), a power of an ICP power supply of 3 kW, a bias power of 200 W, a pressure of 2.0 Pa, and a lower electrode temperature of −10° C.). Accordingly, second sidewall insulating layers 19a and 19b were formed.

Through the process, the example transistor was formed.

Figure 14:
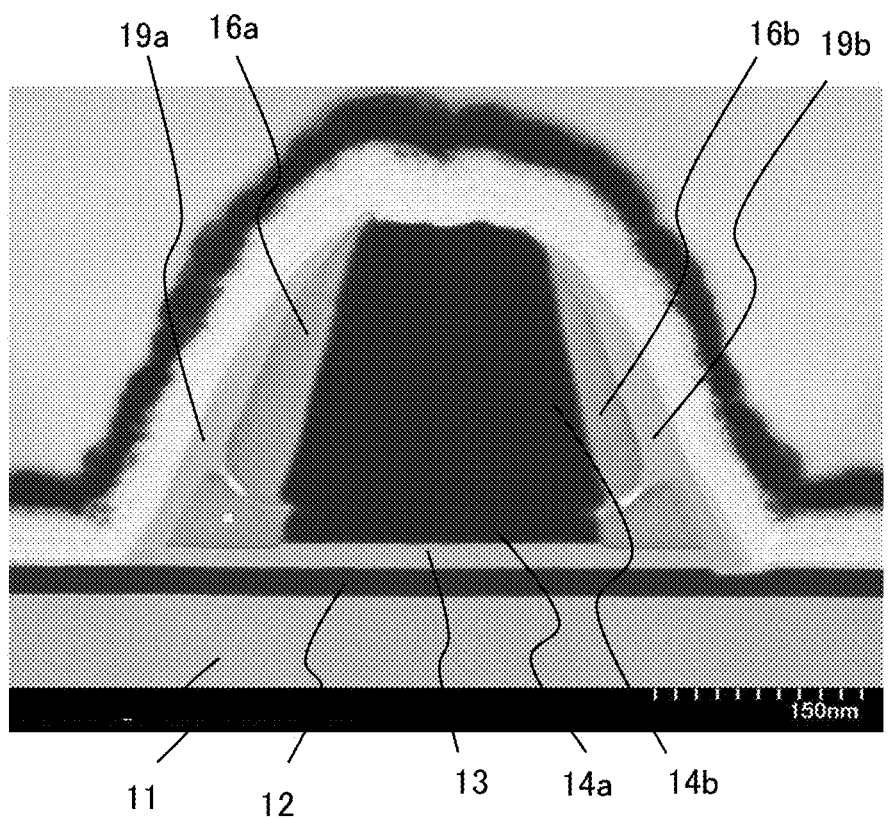
FIG. 14 shows a cross-sectional STEM image of an example transistor.

A cross section in the channel length direction of the example transistor was cut, and a cross section of the example transistor was observed using a scanning transmission electron microscopy (STEM). In this example, as the STEM, an Ultra-thin Film Evaluation System HD-2300 manufactured by Hitachi High-Technologies Corporation was used. FIG. 14 shows a cross-sectional STEM image of the example transistor.

FIG. 14 is a cross-sectional STEM image of the example transistor in the channel length direction. There is a portion with poor coverage in the first sidewall insulating layers 16a and 16b formed of an aluminum oxide film at a step in the vicinity where the gate electrode layers 14a and 14b are in contact with the gate insulating film 13. When a source electrode layer and a drain electrode layer are provided in contact with the first sidewall insulating layers 16a and 16b having such a portion with poor coverage, electrical defects such as a short-circuit and leakage current between the gate electrode layers 14a and 14b and the source electrode layer and the drain electrode layer might be caused.

As described in this example, the second sidewall insulating layers 19a and 19b formed of a silicon oxynitride film are provided so as to cover the portion with poor coverage of the first sidewall insulating layers 16a and 16b; thus, the side surfaces of the gate electrode layers 14a and 14b can be covered with the sidewall insulating layers with good coverage.

The second sidewall insulating layers 19a and 19b can prevent electrical defects such as a short circuit and a leakage current between the gate electrode layers 14a and 14b and the source and drain electrode layers. Further, the first sidewall insulating layers 16a and 16b formed of an aluminum oxide film can supply oxygen to the oxide semiconductor film 12 and suppress release of oxygen and entry of impurities such as hydrogen.

As described in this example, a miniaturized transistor having stable and high electrical characteristics can be provided with high yield. Further, also in a semiconductor device including the transistor, high performance, high reliability, and high productivity can be achieved.

Example 2

Figure 15:
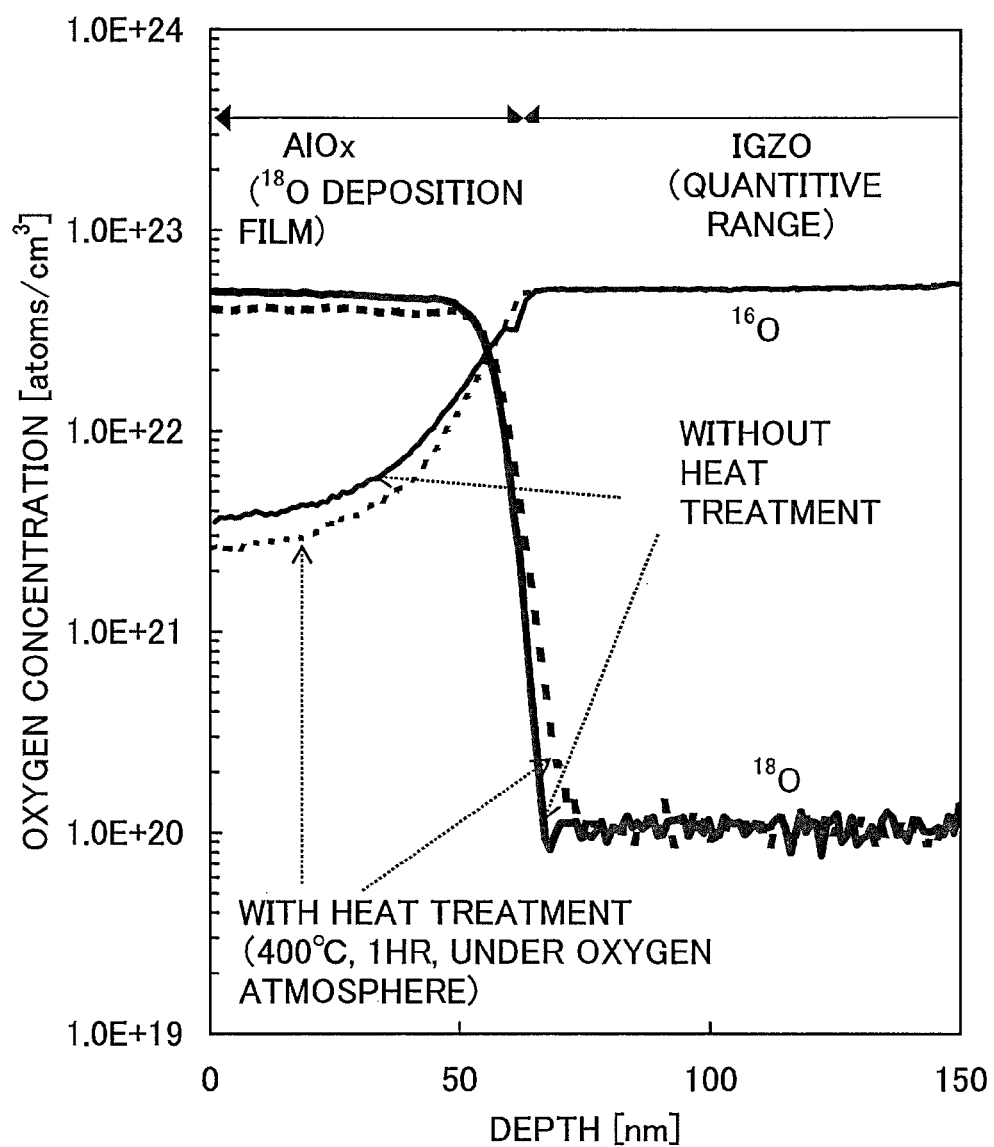
FIG. 15 shows SIMS measurement results of an example sample 2A.
Figure 16:
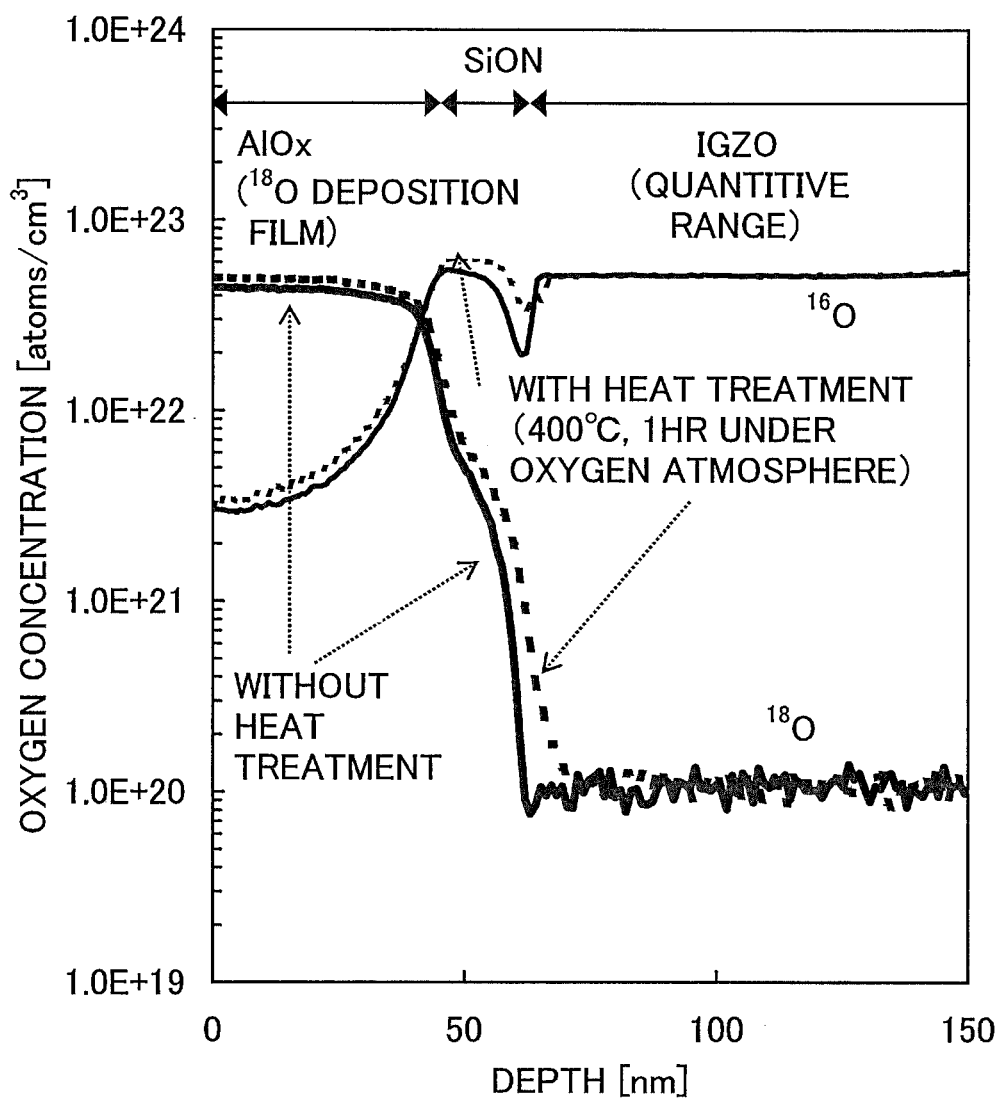
FIG. 16 shows SIMS measurement results of an example sample 2B.

In this example, the oxygen-supply properties of an aluminum oxide film in a semiconductor device according to an embodiment of the disclosed invention were evaluated. FIG. 15 and FIG. 16 show results. As an evaluation method, secondary ion mass spectrometry (SIMS) was used.

First, evaluation by SIMS analysis is described. As samples, an example sample 2A in which, over a glass substrate, an oxide semiconductor film (IGZO film) and an aluminum oxide film were stacked in this order and an example sample 2B in which, over a glass substrate, an insulating film (silicon oxynitride film), an oxide semiconductor film (IGZO film), and an aluminum oxide film were stacked in this order were used.

To make the example samples 2A and 2B, an IGZO film with a thickness of 100 nm was formed as the oxide semiconductor film by a sputtering method using an oxide target with the following atomic ratio, In:Ga:Zn=3:1:2. The deposition conditions were as follows: an atmosphere of argon and oxygen (argon:oxygen=30 sccm:15 sccm), a pressure of 0.4 Pa, a power of 0.5 kW, and a substrate temperature of 200° C.

To make the example sample 2B, a 20-nm-thick silicon oxynitride film was formed as the insulating film by a plasma CVD method. The deposition conditions were as follows: a gas flow rate of $SiH_4$ and $N_2O$ was $SiH_4$:$N_2O$=1 sccm:800 sccm, a pressure of 40 Pa, a power of an RF power supply (power supply output) of 150 W, a power supply frequency of 60 MHz, and a substrate temperature of 400° C.

To make the example samples 2A and 2B, the deposition conditions of the aluminum oxide film were as follows: an aluminum oxide ($Al_2O_3$) target, a pressure of 0.4 Pa, a power supply of 2.5 kW, an atmosphere of argon and oxygen ($^{18}O$) (argon:oxygen=25 sccm:25 sccm (flow rate)), and a substrate temperature of 250° C.

Heat treatment was performed on the example samples 2A and 2B in an oxygen atmosphere at 400° C. for one hour.

As SIMS analysis, substrate side depth profile (SSDP) SIMS was used to measure concentrations of oxygen ($^{16}O$) elements and oxygen ($^{18}O$) elements in the example samples 2A and 2B which were subjected to heat treatment and in the example samples 2A and 2B which were not subjected to heat treatment. Note that oxygen ($^{16}O$) elements and oxygen ($^{18}O$) elements are one of isotopes of oxygen.

FIG. 15 shows concentration profiles by SIMS in the example sample 2A. A fine solid line in FIG. 15 shows a concentration profile of oxygen ($^{16}O$) elements, in which case heat treatment was not performed. A fine dotted line in FIG. 15 shows a concentration profile of oxygen ($^{16}O$) elements, in which case heat treatment was performed. A bold solid line in FIG. 15 shows a concentration profile of oxygen ($^{18}O$) elements, in which case heat treatment was not performed. A bold dotted line in FIG. 15 shows a concentration profile of oxygen ($^{18}O$) elements, in which case heat treatment was performed.

FIG. 16 shows concentration profiles by SIMS in the example sample 2B. A fine solid line in FIG. 16 shows a concentration profile of oxygen ($^{16}O$) elements, in which case heat treatment was not performed. A fine dotted line in FIG. 16 shows a concentration profile of oxygen ($^{16}O$) elements, in which case heat treatment was performed. A bold solid line in FIG. 16 shows a concentration profile of oxygen ($^{18}O$) elements, in which case heat treatment was not performed. A bold dotted line in FIG. 16 shows a concentration profile of oxygen ($^{18}O$) elements, in which case heat treatment was performed.

Note that all the results of SIMS analysis in this example were quantified using a standard sample of an IGZO film.

As shown in FIG. 15, oxygen ($^{18}O$) elements contained in the aluminum oxide film are measured also in the IGZO film; thus, it is found that oxygen ($^{18}O$) elements are supplied from the aluminum oxide film to the IGZO film.

Further, as shown in FIG. 16, also when the silicon oxide film is provided between the aluminum oxide film and an IGZO film, oxygen ($^{18}O$) elements contained in the aluminum oxide film are measured also in the IGZO film; thus, it is found that oxygen ($^{18}O$) elements are supplied from the aluminum oxide film to the IGZO film.

Note that heat treatment promotes the supply of oxygen ($^{18}O$) elements from the aluminum oxide film to the IGZO film.

It was confirmed that the aluminum oxide film can supply oxygen to the oxide semiconductor film and that even when the insulating film as a gate insulating film is provided between the aluminum oxide film and the oxide semiconductor film, oxygen can be supplied from the aluminum oxide film to the oxide semiconductor film through the insulating film.

From the above, it was confirmed that the aluminum oxide film serves as not only a protective film for preventing oxygen release from the oxide semiconductor film but also an oxygen supply source for supplying oxygen to the oxide semiconductor film.

Accordingly, when an aluminum oxide film is provided as a sidewall insulating layer so as to be in contact with an oxide semiconductor film, oxygen vacancies in the oxide semiconductor film can be repaired and an oxygen-excessive state can be maintained.

By using the oxide semiconductor film for a transistor, variation in the threshold voltage of the transistors and change in electrical characteristics such as a shift of the threshold voltage due to an oxygen vacancy can be reduced. Thus, a semiconductor device which includes a reliable transistor having stable electrical characteristics and favorable electrical characteristics can be provided.

This application is based on Japanese Patent Application serial No. 2011-264383 filed with Japan Patent Office on Dec. 2, 2011, the entire contents of which are hereby incorporated by reference.

What is claimed is:

1. A method for manufacturing a semiconductor device, the steps comprising:
    forming a first oxide insulating film over a substrate;
    forming an oxide semiconductor layer over the first oxide insulating film;
    forming an insulating film over the oxide semiconductor layer;
    forming a gate electrode layer over the oxide semiconductor layer with the insulating film provided therebetween;
    forming an aluminum oxide film over the insulating film and the gate electrode layer;
    forming a second oxide insulating film over the aluminum oxide film;
    etching the second oxide insulating film to form a second sidewall insulating layer to cover a side surface of the gate electrode layer with the aluminum oxide film provided therebetween;
    etching the aluminum oxide film and the insulating film to form a first sidewall insulating layer and a gate insulating layer;
    forming a conductive film over the oxide semiconductor layer, the gate insulating layer, the gate electrode layer, the first sidewall insulating layer, and the second sidewall insulating layer;
    forming an interlayer insulating film over the conductive film; and
    removing part of the interlayer insulating film and the conductive film by a chemical mechanical polishing method so that the gate electrode layer is exposed and the conductive film is divided to form a source electrode layer and a drain electrode layer.

2. The method for manufacturing the semiconductor device according to claim 1, further comprising:
    introducing a dopant into the oxide semiconductor layer using the gate electrode layer as a mask before the step of forming the aluminum oxide film.

3. The method for manufacturing the semiconductor device according to claim 1,
    wherein the aluminum oxide film is formed by a sputtering method.

4. The method for manufacturing the semiconductor device according to claim 1, further comprising:
    performing a planarization treatment to a surface of the first oxide insulating film before forming the oxide semiconductor layer.

5. The method for manufacturing the semiconductor device according to claim 1, further comprising:
    performing a heat treatment to the aluminum oxide film at a temperature higher than or equal to a temperature where the aluminum oxide film is formed.

6. A method for manufacturing a semiconductor device, the steps comprising:
    forming a first oxide insulating film over a substrate;
    forming an oxide semiconductor layer over the first oxide insulating film;
    forming an insulating film over the oxide semiconductor layer;
    forming a gate electrode layer over the oxide semiconductor layer with the insulating film provided therebetween;
    forming an aluminum oxide film over the insulating film and the gate electrode layer;
    forming a second oxide insulating film over the aluminum oxide film;
    etching the second oxide insulating film to form an oxide insulating layer to cover a side surface of the gate electrode layer with the aluminum oxide film provided therebetween;
    etching the aluminum oxide film using the gate electrode layer and the oxide insulating layer as masks to form a first sidewall insulating layer;
    forming a third oxide insulating film over the oxide semiconductor layer, the gate electrode layer, and the first sidewall insulating layer;
    etching the third oxide insulating film to form a second sidewall insulating layer to cover a side surface of the first sidewall insulating layer;
    etching a portion of the insulating film which is not covered with gate electrode and the first sidewall insulating layer and the second sidewall insulating layer to form a gate insulating layer;
    forming a conductive film over the oxide semiconductor layer, the gate insulating layer, the gate electrode layer, the first sidewall insulating layer, and the second sidewall insulating layer;
    forming an interlayer insulating film over the conductive film; and
    removing part of the interlayer insulating film and the conductive film by a chemical mechanical polishing method so that the gate electrode layer is exposed and the conductive film is divided to form a source electrode layer and a drain electrode layer.

7. The method for manufacturing the semiconductor device according to claim 6, further comprising:
    introducing a dopant into the oxide semiconductor layer using the gate electrode layer as a mask before the step of forming the aluminum oxide film.

8. The method for manufacturing the semiconductor device according to claim 6,
    wherein the aluminum oxide film is formed by a sputtering method.

9. The method for manufacturing the semiconductor device according to claim 6,
    wherein a planarization treatment is performed on a surface of the first oxide insulating film before the oxide semiconductor layer is formed.

10. The method for manufacturing the semiconductor device according to claim 6, further comprising:
    performing a heat treatment to the aluminum oxide film at a temperature higher than or equal to a temperature where the aluminum oxide film is formed.

11. The method for manufacturing the semiconductor device according to claim 6,
    wherein the third oxide insulating film is formed by a chemical vapor deposition method.

12. The method for manufacturing the semiconductor device according to claim 6,
    wherein the oxide insulating layer disappears in the step of etching the aluminum oxide film.

* * * * *